(12) United States Patent
Liu

(10) Patent No.: US 11,063,215 B2
(45) Date of Patent: Jul. 13, 2021

(54) SPACIAL ARRANGMENTS OF AND CRITICAL DIMENSIONS FOR BIT LINE CONTACTS OF THREE-DIMENSIONAL PHASE-CHANGE MEMORY DEVICES

(71) Applicant: YANGTZE MEMORY TECHNOLOGIES CO., LTD., Wuhan (CN)

(72) Inventor: Jun Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/727,852

(22) Filed: Dec. 26, 2019

(65) Prior Publication Data

US 2021/0111341 A1    Apr. 15, 2021

Related U.S. Application Data

(63) Continuation of application No. PCT/CN2019/110947, filed on Oct. 14, 2019.

(51) Int. Cl.
| | |
|---|---|
| *H01L 45/00* | (2006.01) |
| *G11C 13/00* | (2006.01) |
| *H01L 27/24* | (2006.01) |

(52) U.S. Cl.
CPC ...... *H01L 45/1233* (2013.01); *G11C 13/0004* (2013.01); *G11C 13/0026* (2013.01);
(Continued)

(58) Field of Classification Search
CPC ............. H01L 45/1233; H01L 27/2427; H01L 27/2481; H01L 45/06; G11C 13/0026; G11C 13/0004
See application file for complete search history.

(56) References Cited

U.S. PATENT DOCUMENTS

| | | |
|---|---|---|
| 9,007,800 B2 | 4/2015 | Kim et al. |
| 10,147,764 B2 | 12/2018 | Redaelli |

(Continued)

FOREIGN PATENT DOCUMENTS

| | | |
|---|---|---|
| CN | 1469480 A | 1/2004 |
| CN | 101350360 A | 1/2009 |

(Continued)

OTHER PUBLICATIONS

International Search Report issued in corresponding International Application No. PCT/CN2019/110947, dated Jul. 15, 2020, 5 pages.

*Primary Examiner* — Jerome Leboeuf
(74) *Attorney, Agent, or Firm* — Bayes PLLC

(57) ABSTRACT

A three-dimensional (3D) memory device includes parallel lower and upper bit lines, parallel word lines, lower and upper memory cells, a lower bit line contact in contact with the lower bit line, and an upper bit line contact in contact with the upper bit line. The parallel word lines are in a same plane between the lower and the upper bit lines. Each word line is perpendicular to the lower and upper bit lines. Each lower memory cell is disposed at an intersection of the lower bit line and a respective word line. Each upper memory cell is disposed at an intersection of the upper bit line and a respective word line. Each lower or upper memory cell includes stacked a phase-change memory (PCM) element, a selector, and electrodes. At least one of the lower and upper bit line contacts is disposed inclusively between the lower and upper memory cells in a plan view.

20 Claims, 16 Drawing Sheets

(52) U.S. Cl.
CPC ...... *H01L 27/2427* (2013.01); *H01L 27/2481* (2013.01); *H01L 45/06* (2013.01)

(56) References Cited

U.S. PATENT DOCUMENTS

| | | | |
|---|---|---|---|
| 10,482,953 | B1 | 11/2019 | Lin et al. |
| 2008/0258129 | A1 | 10/2008 | Toda |
| 2009/0283737 | A1 | 11/2009 | Kiyotoshi |
| 2010/0187591 | A1 | 7/2010 | Nagashima |
| 2010/0237512 | A1 | 9/2010 | Okukawa et al. |
| 2011/0205783 | A1* | 8/2011 | Murooka ............ G11C 13/004 365/148 |
| 2014/0061575 | A1 | 3/2014 | Pio |
| 2014/0211539 | A1* | 7/2014 | Kanno ................ H01L 27/249 365/148 |
| 2015/0333105 | A1 | 11/2015 | Matamis et al. |
| 2016/0293841 | A1* | 10/2016 | Ikedo ................ H01L 27/2481 |
| 2016/0315120 | A1 | 10/2016 | Sumino |
| 2017/0117328 | A1 | 4/2017 | Terai |
| 2017/0255834 | A1 | 9/2017 | Zhang |
| 2018/0175289 | A1 | 6/2018 | Chen |
| 2018/0233177 | A1* | 8/2018 | Laurent ............... H01L 27/0207 |
| 2018/0358056 | A1 | 12/2018 | Lee et al. |
| 2019/0115071 | A1 | 4/2019 | Nardi et al. |
| 2019/0140022 | A1* | 5/2019 | Jeong ..................... H01L 45/04 |
| 2019/0172502 | A1 | 6/2019 | Jeong et al. |

FOREIGN PATENT DOCUMENTS

| | | |
|---|---|---|
| CN | 101685825 A | 3/2010 |
| CN | 103370745 A | 10/2013 |
| CN | 103456882 A | 12/2013 |
| CN | 108091361 A | 5/2018 |
| CN | 108806746 A | 11/2018 |
| TW | 201737519 A2 | 10/2017 |

* cited by examiner

200

300

401

SPACIAL ARRANGMENTS OF AND CRITICAL DIMENSIONS FOR BIT LINE CONTACTS OF THREE-DIMENSIONAL PHASE-CHANGE MEMORY DEVICES

CROSS-REFERENCE TO RELATED APPLICATIONS

This application is continuation of International Application No. PCT/CN2019/110947, filed on Oct. 14, 2019, entitled "THREE-DIMENSIONAL PHASE-CHANGE MEMORY DEVICES," which is hereby incorporated by reference in its entirety. This application is also related to co-pending U.S. application Ser. No. 16/727853, filed on even date, entitled "METHODS FOR FORMING THREE-DIMENSIONAL PHASE-CHANGE MEMORY DEVICES," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array. For example, phase-change memory (PCM) can utilize the difference between the resistivity of the amorphous and the crystalline phase in phase-change materials based on heating and quenching of the phase-change materials electrothermally. PCM array cells can be vertically stacked in 3D to form a 3D PCM.

SUMMARY

Embodiments of 3D memory devices and methods for forming the same are disclosed herein.

In an example, a 3D memory device includes a lower bit line and an upper bit line parallel to one another, a plurality of parallel word lines, a plurality of lower memory cells and a plurality of upper memory cells, a lower bit line contact in contact with the lower bit line, and an upper bit line contact in contact with the upper bit line. The parallel word lines are in a same plane between the lower bit line and the upper bit line. Each of the word lines is perpendicular to the lower bit line and the upper bit line. The plurality of lower memory cells each are disposed at an intersection of the lower bit line and a respective one of the word lines. The plurality of upper memory cells each are disposed at an intersection of the upper bit line and a respective one of the word lines. Each of the lower and upper memory cells includes stacked a phase-change memory (PCM) element, a selector, and a plurality of electrodes. At least one of the lower bit line contact and the upper bit line contact is disposed inclusively between the lower and upper memory cells in a plan view.

In another example, a 3D memory device includes a lower bit line and an upper bit line parallel to one another, a plurality of parallel word lines, a plurality of lower memory cells and a plurality of upper memory cells, a lower bit line contact in contact with the lower bit line, and an upper bit line contact in contact with the upper bit line. The parallel word lines are in a same plane between the lower bit line and the upper bit line. Each of the word lines is perpendicular to the lower bit line and the upper bit line. The plurality of lower memory cells each are disposed at an intersection of the lower bit line and a respective one of the word lines. The plurality of upper memory cells each are disposed at an intersection of the upper bit line and a respective one of the word lines. Each of the lower and upper memory cells includes stacked a PCM element, a selector, and a plurality of electrodes. A critical dimension of at least one of the lower bit line contact and the upper bit line contact is not greater than a critical dimension of the corresponding lower bit line or upper bit line.

In still another example, a 3D memory device includes an array of 3D PCM cells disposed in a memory array region, a plurality of word lines and a plurality of bit lines of the 3D PCM cells in a cross-point structure, and a plurality of bit line contacts. Each of the word lines extends across the memory array region in a word line direction. Each of the bit lines extends across the memory array region in a bit line direction perpendicular to the word line direction. At least some of the bit line contacts are disposed within the memory array region.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
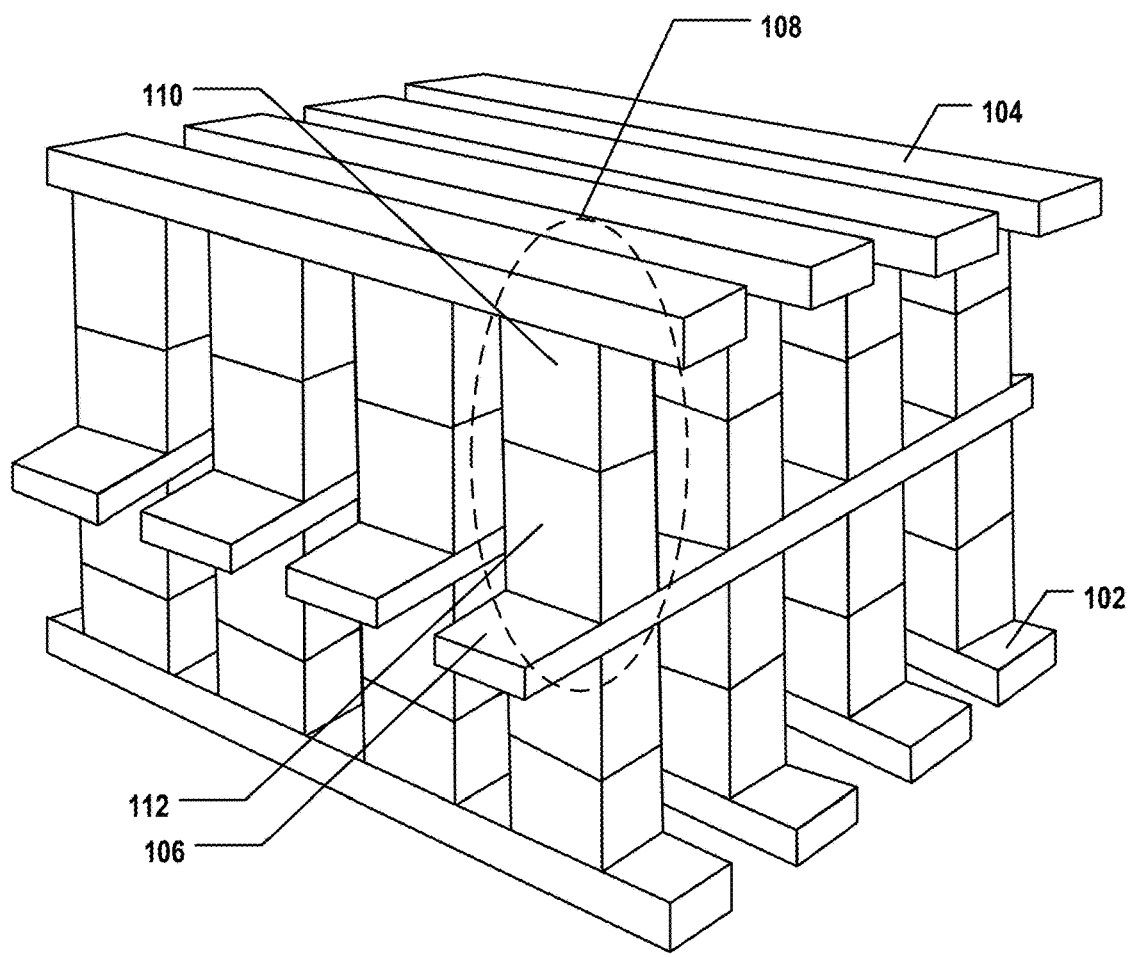
FIG. 1 illustrates a perspective view of an exemplary 3D XPoint memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with memory cells that can be arranged vertically on a laterally-oriented substrate so that the number of memory cells can be scaled up in the vertical direction with respect to the substrate. As used herein, the term "vertical/vertically" means nominally perpendicular to the lateral surface of a substrate.

A PCM can utilize the difference between the resistivity of the amorphous and the crystalline phase in phase-change materials (e.g., chalcogenide alloys) based on heating and quenching of the phase-change materials electrothermally. The phase-change material in a PCM cell can be located between two electrodes, and electrical currents can be applied to switch the material (or at least a fraction of it that blocks the current path) repeatedly between the two phases to store data. PCM cells can be vertically stacked in 3D to form a 3D PCM.

3D PCMs include 3D XPoint memory, which stores data based on a change in resistance of the bulk material property (e.g., in a high-resistance state or a low-resistance state), in conjunction with a stackable cross-point data access array to be bit-addressable. For example, FIG. 1 illustrates a perspective view of an exemplary 3D XPoint memory device 100. 3D XPoint memory device 100 has a transistor-less, cross-point architecture that positions memory cells at the intersections of perpendicular conductors, according to some embodiments. 3D XPoint memory device 100 includes a plurality of parallel lower bit lines 102 in the same plane and a plurality of parallel upper bit lines 104 in the same plane above lower bit lines 102. 3D XPoint memory device 100 also includes a plurality of parallel word lines 106 in the same plane vertically between lower bit lines 102 and upper bit lines 104. As shown in FIG. 1, each lower bit line 102 and each upper bit line 104 extend laterally along the bit line direction in the plan view (parallel to the wafer plane), and each word line 106 extends laterally along the word line direction in the plan view. Each word line 106 is perpendicular to each lower bit line 102 and each upper bit line 104.

It is noted that x and y axes are included in FIG. 1 to illustrate two orthogonal directions in the wafer plane. The x-direction is the word line direction, and the y-direction is the bit line direction. It is noted that z axis is also included in FIG. 1 to further illustrate the spatial relationship of the components in 3D XPoint memory device 100. The substrate (not shown) of 3D XPoint memory device 100 includes two lateral surfaces extending laterally in the x-y plane: a top surface on the front side of the wafer, and a bottom surface on the backside opposite to the front side of the wafer. The z axis is perpendicular to both the x and y axes. As used herein, whether one component (e.g., a layer or a device) is "on," "above," or "below" another component (e.g., a layer or a device) of a semiconductor device (e.g., 3D XPoint memory device 100) is determined relative to the substrate of the semiconductor device in the z-direction (the vertical direction perpendicular to the x-y plane) when the substrate is positioned in the lowest plane of the semiconductor device in the z-direction. The same notion for describing the spatial relationship is applied throughout the present disclosure.

As shown in FIG. 1, 3D XPoint memory device 100 includes a plurality of memory cells 108 each disposed at an intersection of lower or upper bit line 102 or 104 and respective word line 106. Each memory cell 108 includes at least a PCM element 110 and a selector 112 stacked vertically. Each memory cell 108 stores a single bit of data and can be written or read by varying the voltage applied to respective selector 112, which replaces the need for transistors. Each memory cell 108 is accessed individually by a current applied through the top and bottom conductors in contact with each memory cell 108, e.g., respective word line 106 and lower or upper bit line 102 or 104. Memory cells 108 in 3D XPoint memory device 100 are arranged in a memory array.

In existing 3D XPoint memory, the bit line contacts to the upper and lower bit lines are arranged at both sides outside of the memory array in the plan view. Because the 3D XPoint memory is composed of a number of memory arrays surrounded by bit line contacts, the bit line contact regions occupy a significant portion of the device area, which reduces array efficiency. For example, FIG. 2A illustrates a block diagram of an exemplary 3D XPoint memory device 200, FIG. 2B illustrates a plan view of the exemplary 3D XPoint memory device 200 in FIG. 2A, and FIG. 2C illustrates a perspective view of the exemplary 3D XPoint memory device 200 in FIG. 2A.

Figure 2A:
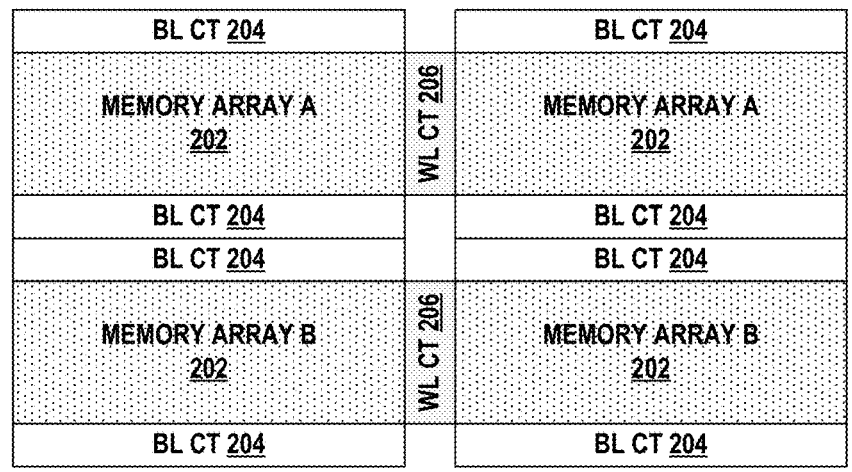
FIG. 2A illustrates a block diagram of an exemplary 3D XPoint memory device.

As shown in FIG. 2A, 3D XPoint memory device 200 includes two memory arrays A and B 202 each including an array of 3D XPoint memory cells. For each memory array 202, bit line contacts are disposed in two bit line contact regions (BL CT) 204 surrounding and outside of memory array 202. That is, two bit line contact regions 204 are arranged at both sides of respective memory array 202 in the bit line direction (the y-direction), but do not overlap memory array 202 in the plan view. As a result, dedicated bit line contact regions 204 occupy a significant portion of the device area in the bit line direction, thereby reducing array efficiency and complicating the interconnect routing scheme. 3D XPoint memory device 200 also includes word line contacts in a word line contact region (WL CT) 206 at the middle of respective memory array 202 in the word line direction (the x-direction).

Figure 2B:
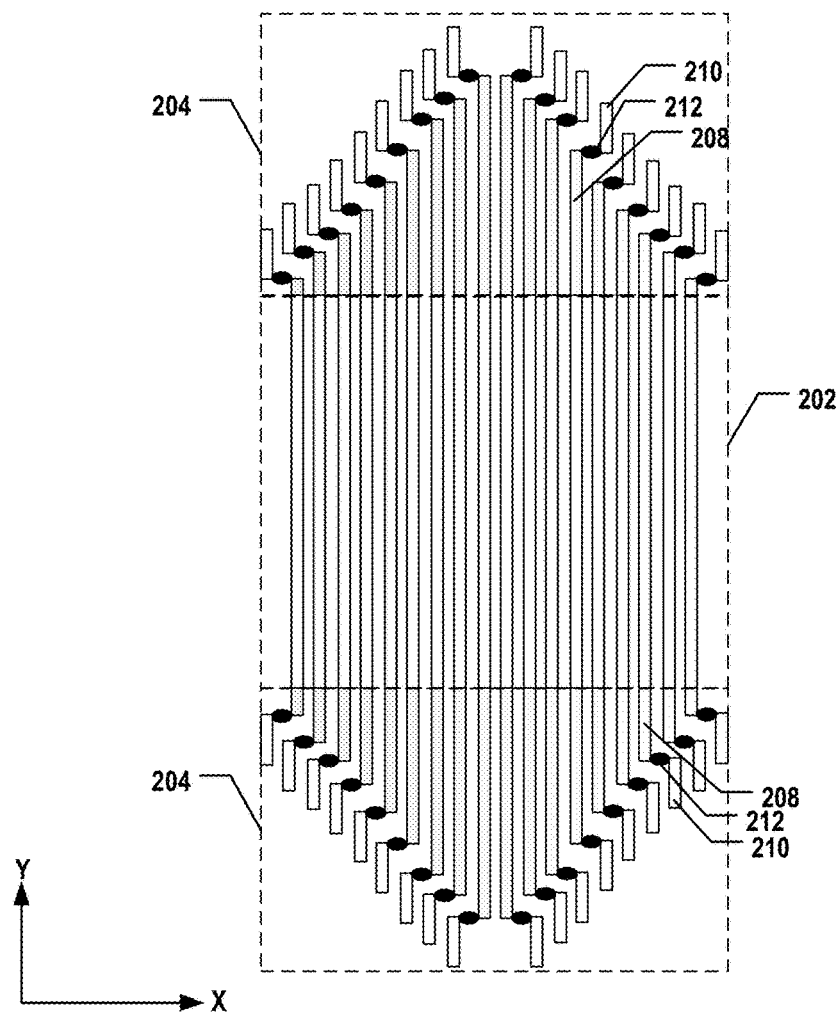
FIG. 2B illustrates a plan view of the exemplary 3D XPoint memory device in FIG. 2A.
Figure 2C:
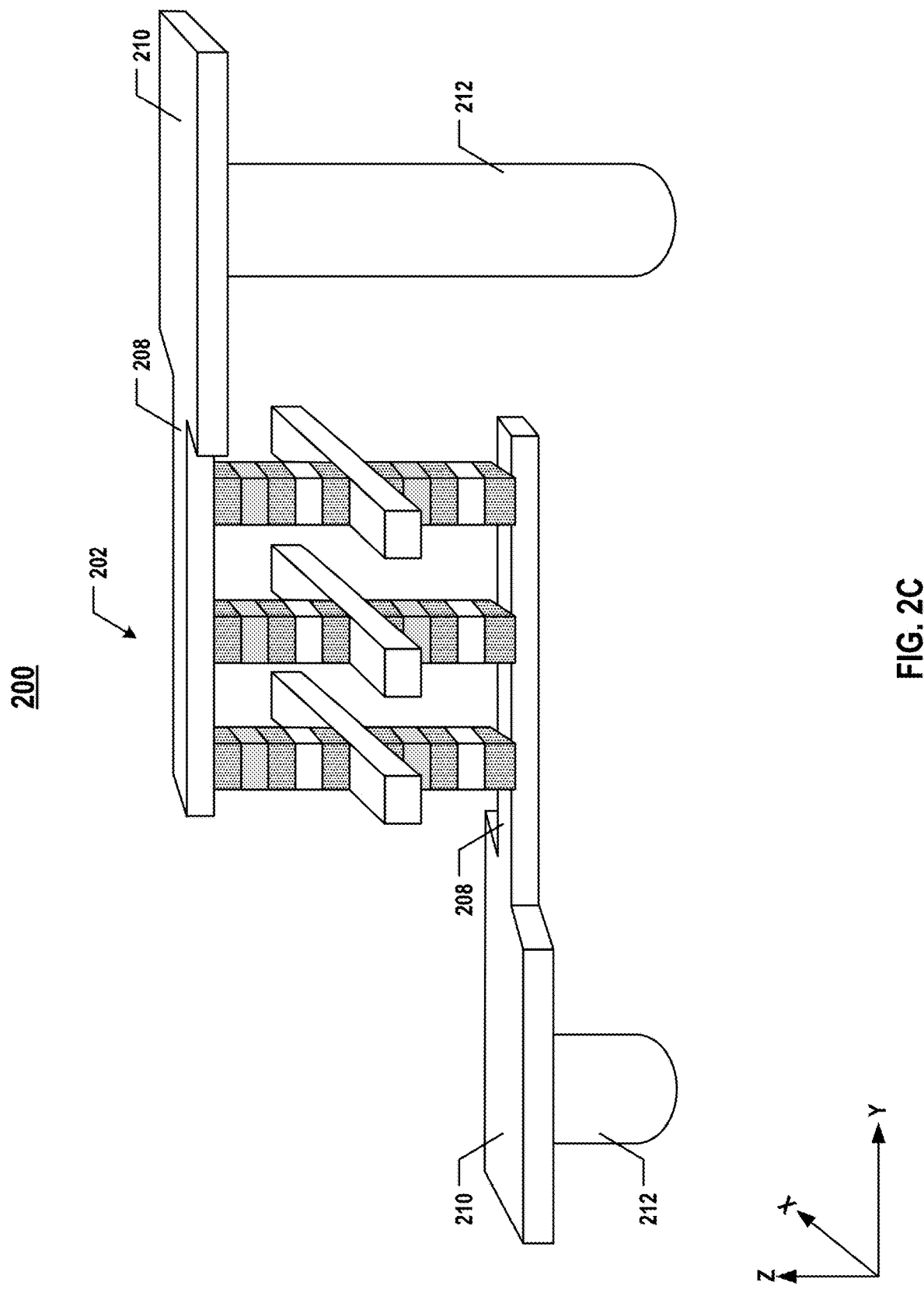
FIG. 2C illustrates a perspective view of the exemplary 3D XPoint memory device in FIG. 2A.

As shown in FIG. 2B, each bit line 208 (either a lower bit line or an upper bit line) extends beyond and outside of memory array 202 in the bit line direction. At one or both ends of each bit line 208 outside of memory array 202, a bit line extension 210 having a critical dimension greater than that of bit line 208 is formed to place a bit line contact 212 with a relaxed critical dimension compared with bit line 208. That is, the critical dimension of bit line contact 212 is greater than that of bit line 208, which further increases the size of bit line contact region 204 and reduces the array efficiency. For example, as shown in the perspective view of FIG. 2C, as each bit line 208 extends laterally in either bit line direction outside of memory array 202, the critical dimension thereof is increased to form respective bit line extension 210. Bit line contacts 212 with a relaxed critical dimension, e.g., greater than that of bit line 208, are disposed below and in contact with each bit line extension 210, i.e., extending downwards in the same vertical direction.

Various embodiments in accordance with the present disclosure provide an improved interconnect scheme for 3D PCM memory devices, e.g., 3D XPoint memory device, and fabrication method thereof. The bit line contacts can be formed within the memory array region, which eliminates the need for dedicated bit line contact regions outside of the memory array region, thereby increasing memory array efficiency and simplifying the interconnect routing. In some embodiments, the bit line contacts are disposed inclusively between the memory cells in the plan view, i.e., overlapping the memory array. In some embodiments, the critical dimension of the bit line contacts is not greater than the critical dimension of the corresponding bit line. That is, the critical dimension of the bit line contacts is no longer relaxed compared with cirtial dimension of the bit lines, and the bit line contact size can be shrunk to further save contact area. To form bit line contacts with non-relaxed critical dimension, in-situ polymer deposition and etching scheme is used, according to some embodiments.

Figure 3A:
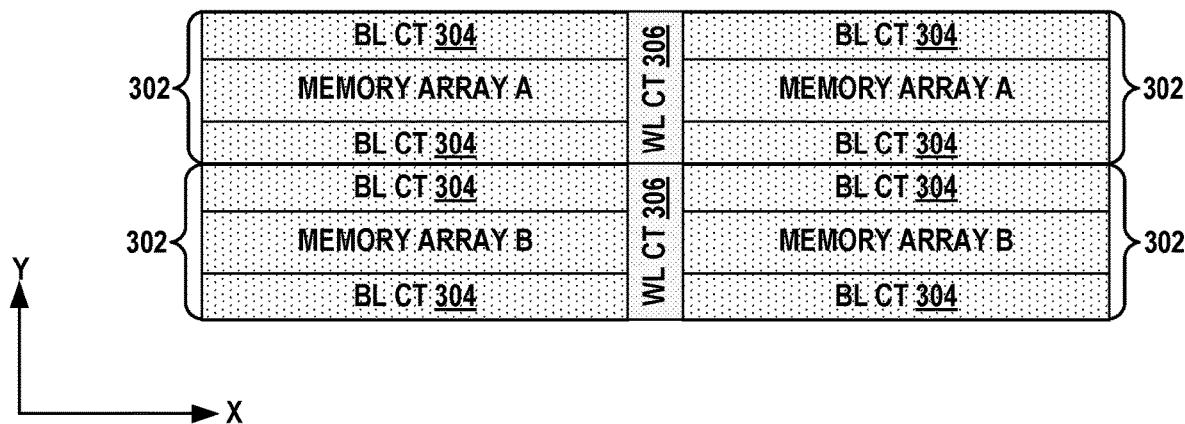
FIG. 3A illustrates a block diagram of an exemplary 3D PCM memory device, according to some embodiments of the present disclosure.

FIG. 3A illustrates a block diagram of an exemplary 3D PCM memory device 300, according to some embodiments of the present disclosure. 3D PCM memory device 300, such as a 3D XPoint memory device, can include a plurality of memory arrays A and B 302 each including an array of 3D PCM cells disposed in a memory array region. For each memory array 302, 3D PCM memory device 300 can also include bit line contacts disposed in two bit line contact regions (BL CT) 304 at two ends of the memory array region in the bit line direction (the y-direction). Different from 3D XPoint memory device 200 in FIG. 2A in which the bit line contacts are outside of the memory array regions, at least some of the bit line contacts in 3D PCM memory device 300 are disposed within the memory array regions. As shown in FIG. 3A, each bit line contact region 304 completely overlaps respective memory array 302, according to some embodiments. That is, each of the bit line contacts in bit line contact region 304 is disposed within the memory array region, according to some embodiments. For each memory array 302, 3D PCM memory device 300 can further include a word line contact region (WL CT) 306 at the middle of the memory array region in the word line direction (the x-direction). The word line contacts of 3D PCM memory device 300 can be disposed in word line contact region 306. In some embodiments, each of the word line contacts is disposed within the memory array region. By arranging both word line contact region 306 and bit line contact regions 304 within the memory array region of respective memory array 302, the contact area can be saved, and the memory array efficiency can be improved.

Figure 3B:
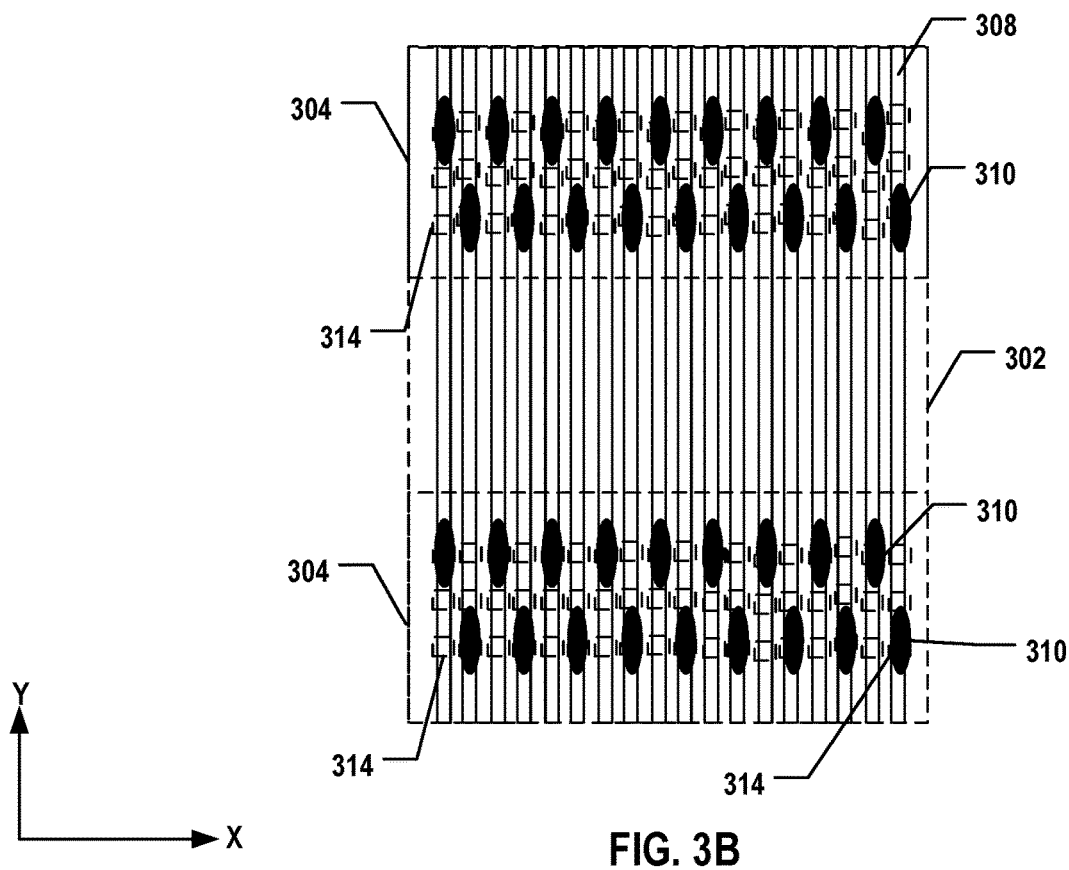
FIG. 3B illustrates a plan view of the exemplary 3D PCM memory device in FIG. 3A, according to some embodiments of the present disclosure.

FIG. 3B illustrates a plan view of the exemplary 3D PCM memory device 300 in FIG. 3A, according to some embodiments of the present disclosure. As shown in FIG. 3B, 3D PCM memory device 300 can further include a plurality of bit lines 308. Each bit line 308 extends across the memory array region of memory array 302 in the bit line direction (the y-direction), according to some embodiments. Different from bit lines 208 in 3D XPoint memory device 200 in FIG. 2B that extend beyond and outside of memory array 302, bit lines 308 in 3D PCM memory device 300 are disposed within the memory array region of memory array 302. Unlike 3D XPoint memory device 200 including bit line extensions 210 with relaxed critical dimension on which bit line contacts 212 are formed, 3D PCM memory device 300 includes bit line contacts 310 in contact with respective bit line 308 directly. Each bit line contact 310 can be disposed in bit line contact region 304 within the memory array region of memory array 302. In some embodiments, the critical dimension of each bit line contact 310 is not greater than the critical dimension of each bit line 308. That is, the critical dimension of bit line contacts 310 is no longer relaxed compared with bit lines 308, according to some embodiments. Thus, the bit line contact size can be shrunk to further save contact area. It is understood that although each bit line 308 is in contact with two bit line contacts 310 in two bit line contact regions 304, respectively, as shown in FIG. 3B, one or more of bit lines 308 may be in contact with only one bit line contact 310 in either one of two bit line contact regions 304 in some other embodiments.

Figure 3C:
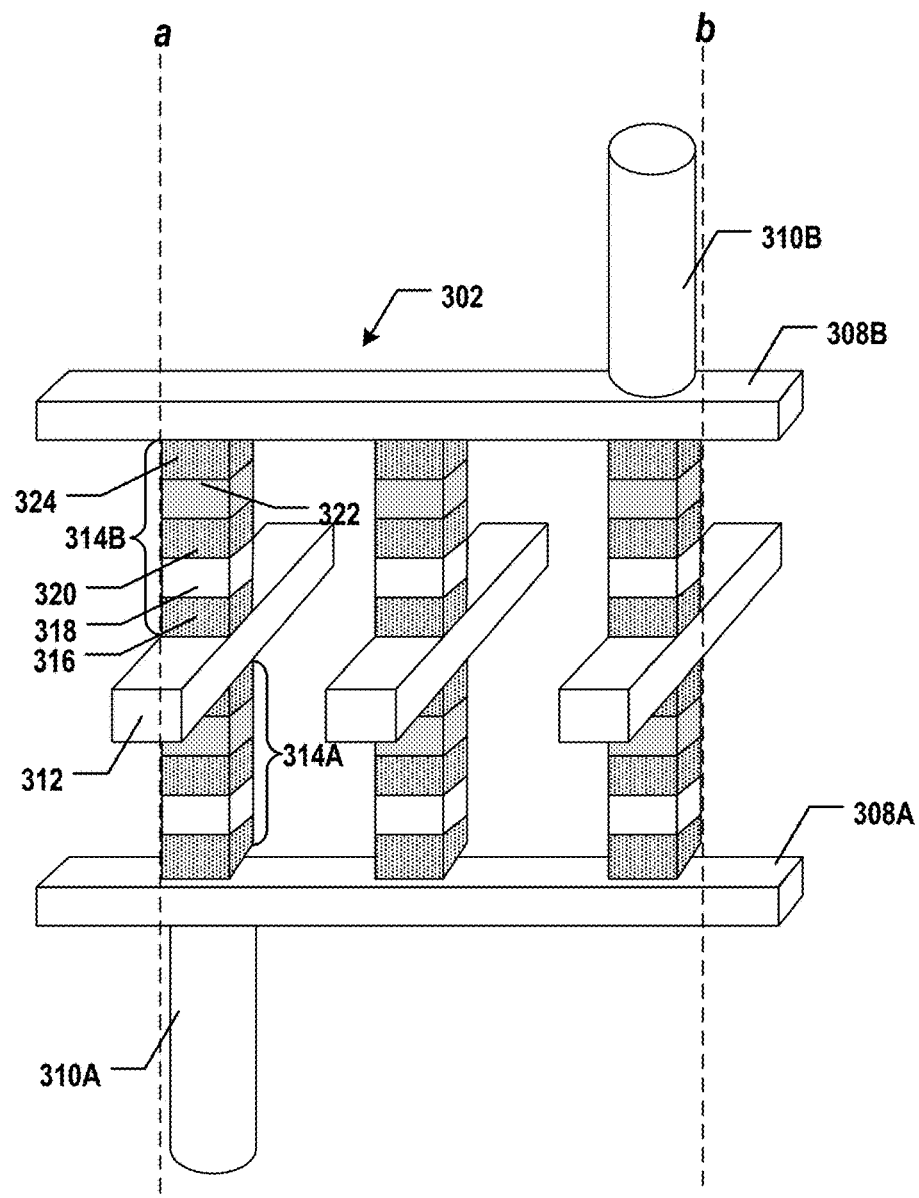
FIG. 3C illustrates a perspective view of the exemplary 3D PCM memory device in FIG. 3A, according to some embodiments of the present disclosure.

FIG. 3C illustrates a perspective view of the exemplary 3D PCM memory device 300 in FIG. 3A, according to some embodiments of the present disclosure. As shown in FIG. 3C, 3D PCM memory device 300 can further include a plurality of word lines 312. Each word line 312 extends across the memory array region of memory array 302 in the word line direction (the x-direction), according to some embodiments. That is, word lines 312 and bit lines 308 of 3D PCM memory device 300, such as a 3D XPoint memory device, can be perpendicularly-arranged conductors in a cross-point structure.

In some embodiments, 3D PCM memory device 300 includes a lower bit line 308A and an upper bit line 308B parallel to one another. For example, as shown in FIG. 3C, each of lower bit line 308A and upper bit line 308B may extend laterally across memory array 302 in the bit line direction (y-direction). Lower bit line 308A and upper bit line 308B have the same critical dimension, e.g., the same width in the x-direction, according to some embodiments. In one example, the critical dimension of lower bit line 308A and upper bit line 308B may be about 20 nm, and the pitch of lower bit line 308A and upper bit line 308B may be about 40 nm. In some embodiments, 3D PCM memory device 300 also includes parallel word lines 312 in the same plane between lower bit line 308A and upper bit line308B in the z-direction. Each of word lines 312 is perpendicular to lower bit line 308A and upper bit line 308B, according to some embodiments. In one example, the critical dimension, e.g., the width in the y-direction, of word lines 312 may be about 20 nm, and the pitch of word lines 312 is about 40 nm. Lower bit lines 308A, upper bit line 308B, and word lines 312 can include conductive materials including, but not limited to, tungsten (W), cobalt (Co), copper (Cu), aluminum (Al), polysilicon, doped silicon, silicides, or any combination thereof. In some embodiments, each of lower bit lines 308A, upper bit line 308B, and word lines 312 includes a metal, such as tungsten.

In some embodiments, 3D PCM memory device 300 includes a plurality of lower memory cells 314A each disposed at an intersection of lower bit line 308A and a respective one of word lines 312, and a plurality of upper memory cells 314B each disposed at an intersection of upper bit line 308B and a respective one of word lines 312. Each memory cell 314A or 314B can be accessed individually by a current applied through respective word line 312 and bit line 308A or 308B in contact with memory cell 314A or 314B. Each of lower and upper memory cells 314A and 314B can include stacked a PCM element 322, a selector 318, and a plurality of electrodes 316, 320, and 324. PCM element 322 can utilize the difference between the resistivity of the amorphous and the crystalline phase in phase-change materials based on heating and quenching of the phase-change materials electrothermally. Electrical currents can be applied to switch the phase-change material (or at least a fraction of it that blocks the current path) of PCM element 322 repeatedly between the two phases to store data. A single bit of data can be stored in each memory cell 314A or 314B and can be written or read by varying the voltage applied to respective selector 318, which eliminates the need for transistors. In some embodiments, three electrodes 316, 320, and 324 are disposed below selector 318, between selector 318 and PCM element 322, and above PCM element 322, respectively. It is understood that the relative positions of selector 318 and PCM element 322 may be switched in some other embodiments.

In some embodiments in which 3D PCM memory device 300 is a 3D XPoint memory device, selector 318 and PCM element 322 can be in a double-stacked storage/selector structure. The materials of PCM element 322 include chalcogenide-based alloys (chalcogenide glass), such as GST (Ge—Sb—Te) alloy, or any other suitable phase-change materials, according to some embodiments. The materials of selector 318 can include any suitable ovonic threshold switch (OTS) materials, such as $Zn_xTe_y$, $Ge_xTe_y$, $Nb_xO_y$, $Si_xAs_yTe_z$, etc. It is understood that the structure, configuration, and materials of memory array 302 are not limited to the example in FIG. 3C and may include any suitable structure, configuration, and materials. Electrodes 316, 320, and 324 can include conductive materials including, but not limited to, W, Co, Cu, Al, carbon, polysilicon, doped silicon, silicides, or any combination thereof. In some embodiments, each of electrodes 316, 320, and 324 includes carbon, such as amorphous carbon.

As shown in FIG. 3C, 3D PCM memory device 300 can further include a lower bit line contact 310A below and in contact with lower bit line 308A, and an upper bit line contact 310B above and in contact with upper bit line 308B. Lower bit line contact 310A extends downwards, and upper bit line contact 310B extends upwards, according to some embodiments. That is, lower and upper bit line contacts 310A and 310B can extend vertically in opposite directions. Lower bit line contact 310A and upper bit line contact 310B can include conductive materials including, but not limited to, W, Co, Cu, Al, polysilicon, doped silicon, silicides, or any combination thereof. In some embodiments, each of lower bit line contact 310A and upper bit line contact 310B includes a metal, such as tungsten. Thus, lower bit line contact 310A and upper bit line contact 310B are electrically connected to lower bit line 308A and upper bit line 308B, respectively, for individually addressing respective lower memory cell 314A or upper memory cell 314B.

As described above, bit line contacts 310A and 310B can have a non-relaxed critical dimension, i.e., shrunk contact size, to further efficiently use the chip space. In some embodiments, the critical dimension (e.g., the diameter) of at least one of lower bit line contact 310A and upper bit line contact 310B is not greater than the critical dimension (e.g., the width in the x-direction) of corresponding lower bit line 308A or upper bit line 308B. In one example, the critical dimension of at least one of lower bit line contact 310A and upper bit line contact 310B may be the same as the critical dimension of corresponding lower bit line 308A or upper bit line 308B. In another example, the critical dimension of at least one of lower bit line contact 310A and upper bit line contact 310B may be smaller than the critical dimension of corresponding lower bit line 308A or upper bit line 308B. In some embodiments, the critical dimension of at least one of lower and upper bit line contacts 310A and 310B is not greater than about 60 nm, such as not greater than 60 nm. In some embodiments, the critical dimension of at least one of lower and upper bit line contacts 310A and 310B is between about 10 nm and about 30 nm, such as between 10 nm and 30 nm (e.g., 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, any range bounded by the lower end by any of these values, or in any range defined by any two of these values). In some embodiments, the critical dimension of each of lower and upper bit line contacts 310A and 310B is not greater than the critical dimension of each of lower and upper bit lines 308A and 308B. In some embodiments, the critical dimension of both bit lines 308A and 308B and bit line contacts 310A and 310B is about 20 nm, such as 20 nm.

In some embodiments, at least one of lower and upper bit line contacts 310A and 310B has the same pitch as corresponding lower bit line 308A or upper bit line 308B. In some embodiments, the pitch is not greater than about 80 nm, such as not greater than 80 nm. In some embodiments, the pitch is between about 20 nm and about 60 nm, such as between 20 nm and 60 nm (e.g., 20 nm, 22 nm, 24 nm, 26 nm, 28 nm, 30 nm, 32 nm, 34 nm, 36 nm, 38 nm, 40 nm, 42 nm, 44 nm, 46 nm, 48 nm, 50 nm, 52 nm, 54 nm, 56 nm, 58 nm, 60 nm, any range bounded by the lower end by any of these values, or in any range defined by any two of these values). In some embodiments, the pitch of each of lower and upper bit line contacts 310A and 310B is not greater than the pitch of each of lower and upper bit lines 308A and 308B. In some embodiments, the pitch of both bit lines 308A and 308B and bit line contacts 310A and 310B is about 40 nm, such as 40 nm. By having bit line contacts 310A and 310B with non-relaxed critical dimension and pitch, bit line contacts 310A and 310B can be in contact with bit lines 308A and 308B directly, as opposed to being in contact with bit line extensions (e.g., 210 as shown in FIG. 2C).

In some embodiments, at least one of lower bit line contact 310A and upper bit line contact 310B is disposed inclusively between lower and upper memory cells 314A and 314B of memory array 302 in the plan view (parallel to the wafer plane). As used herein, a bit line contact 310A or 310B is disposed "inclusively between" memory cells 314A and 314B of memory array 302 (i) when the bit line contact 310A or 310B overlaps at least one of memory cells 314A and 314B in the plan view, or (ii) when the bit line contact 310A or 310B is disposed between memory cells 314A and 314B in the plan view. As shown in FIG. 3C, since memory cells 314A and 314B are arranged at the intersections of word lines 312 and bit lines 308A and 308B and each bit line contact 310A or 310B is in contact with respective bit line 308A or 308B, the outermost memory cells 314A and 314B of memory array 302 in the bit line direction (the y-direction) define a range (between the boundaries "a" and "b") in which lower bit line contact 310A and/or upper bit line contact 310B can be disposed. In the example shown in FIG. 3C, both lower bit line contact 310A and upper bit line contact 310B overlap outermost memory cells 314A and 314B, respectively. In other words, each bit line contact 310A or 310B is disposed within the memory array region of memory array 302. It is understood that lower bit line contact 310A and/or upper bit line contact 310B may be disposed in any position inclusively between memory cells 314A and 314B in the plan view (e.g., anywhere between the boundaries "a" and "b" in FIG. 3C). In some embodiments, at least one of lower bit line contact 310A and upper bit line contact 310B is disposed between lower and upper memory cells 314A and 314B of memory array 302 in the plan view, i.e., not overlapping with memory cell 314A or 314B in the plan view.

Figure 4A:
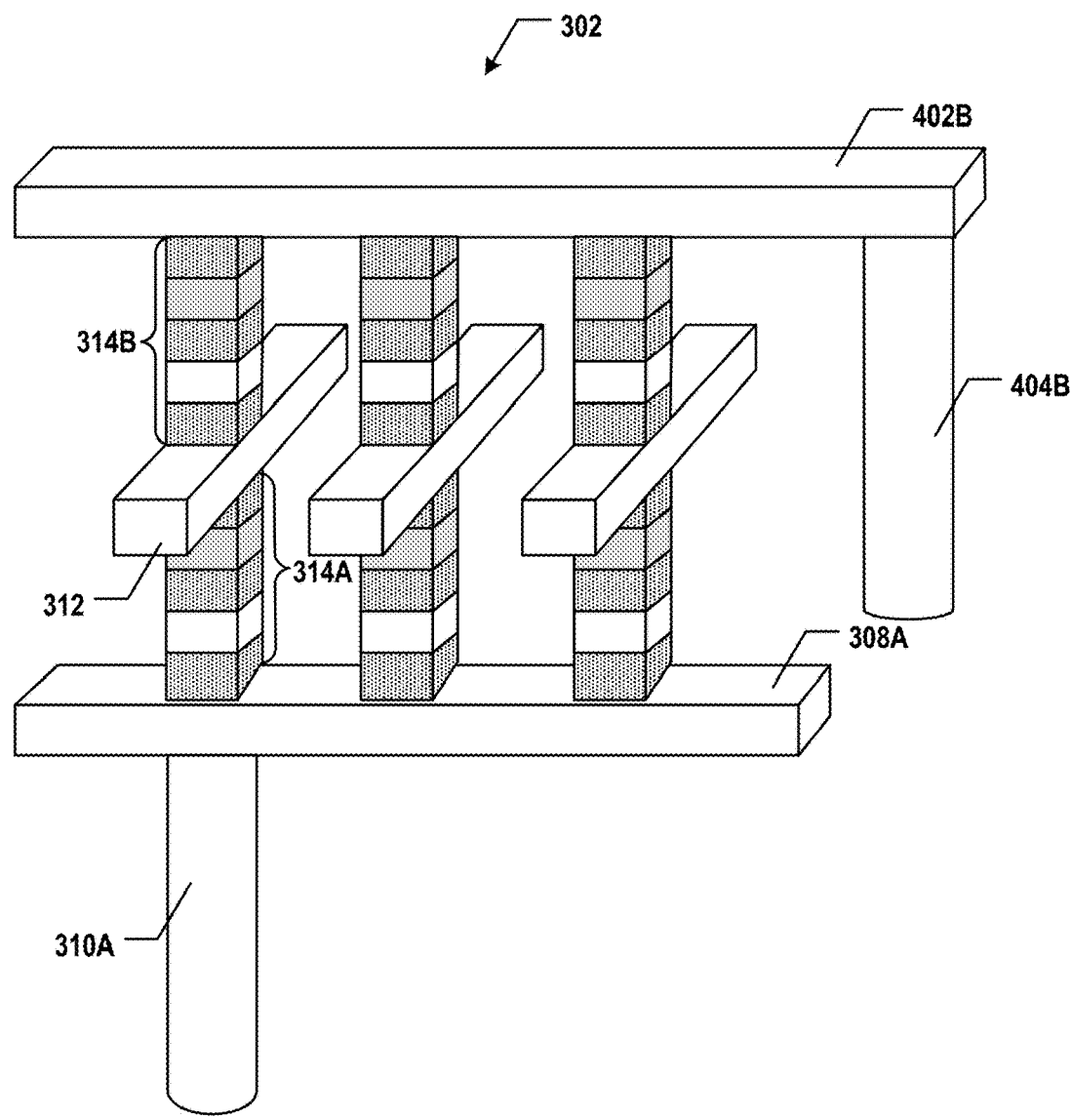
FIG. 4A illustrates a perspective view of another exemplary 3D PCM memory device, according to some embodiments of the present disclosure.
Figure 4B:
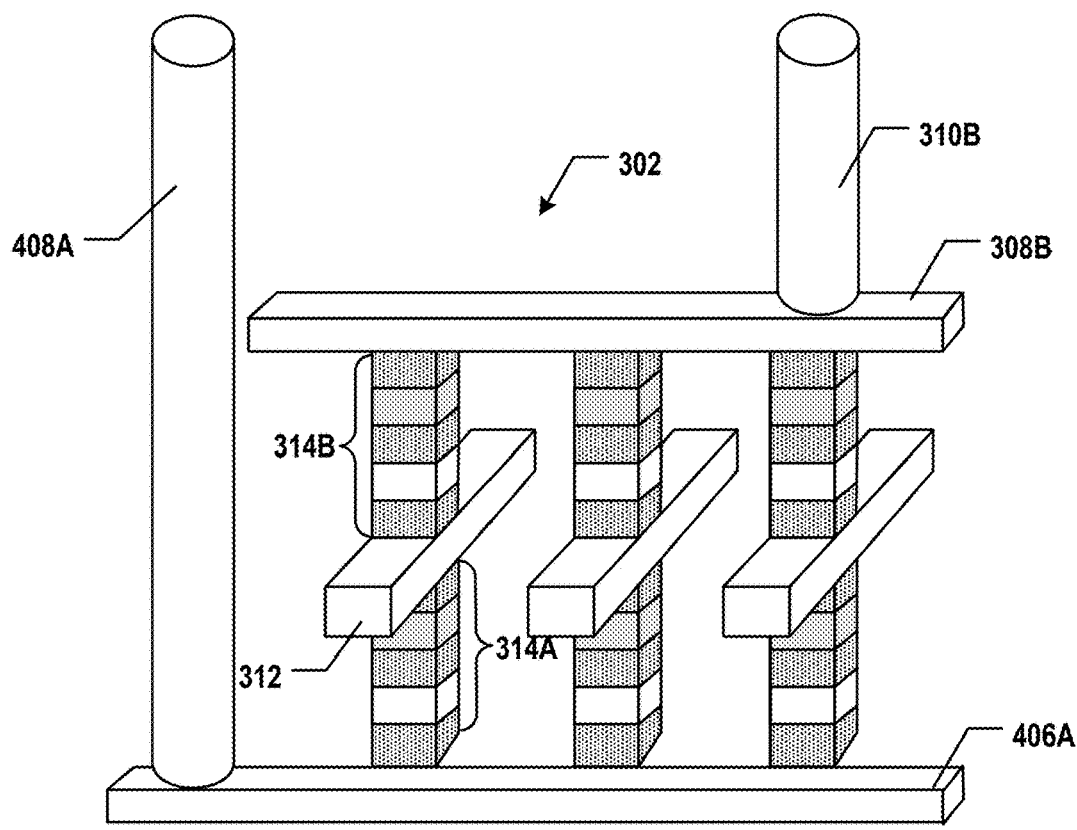
FIG. 4B illustrates a perspective view of still another exemplary 3D PCM memory device, according to some embodiments of the present disclosure.
Figure 4B:
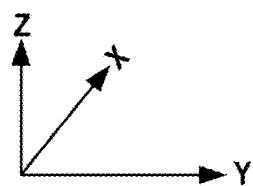

Although in FIG. 3C, each of lower and upper bit line contacts 310A and 310B is disposed inclusively between lower and upper memory cells 314A and 314B of memory array 302 in the plan view, it is understood that one of the lower bit line contact and upper bit line contacts may be disposed outside of the memory array in the plan view in some other embodiments. In other words, the lower bit line contact or the upper bit line contact is disposed inclusively between the lower and upper memory cells in the plan view. For example, FIG. 4A illustrates a perspective view of another exemplary 3D PCM memory device 400, according to some embodiments of the present disclosure, and FIG. 4B illustrates a perspective view of still another exemplary 3D PCM memory device 401, according to some embodiments of the present disclosure. 3D PCM memory device 400 is similar to 3D PCM memory device 300 in FIG. 3C except for the upper bit line and upper bit line contact. The structures, functions, and materials of the same components that have been described above with respect to 3D PCM memory device 300 in FIG. 3C are not repeated for ease of description.

As shown in FIG. 4A, upper bit line 402B extends laterally beyond memory array 302 in the bit line direction (the y-direction), and upper bit line contact 404B in contact with upper bit line 402B is not disposed inclusively between lower and upper memory cells 314A and 314B of memory array 302 in the plan view, according to some embodiments. That is, lower bit line contact 310A is disposed within the memory array region of memory array 302, while upper bit line contact 404B is disposed outside of the memory array region of memory array 302, according to some embodiments. In some embodiments, lower bit line contact 310A and upper bit line contact 404B extend towards the same direction, e.g., downwards as shown in FIG. 4A, such that bit line contacts 310A and 404B can be padded-out from the same side of 3D PCM memory device 400. Although upper bit line 402B extends beyond memory array 302 in FIG. 4A, it is understood that the critical dimension of upper bit line 402B may not increase, i.e., not forming an upper bit line extension, and the critical dimension (e.g., the diameter) of upper bit line contact 404B may not be greater than the critical dimension (e.g., the width in the x-direction) of upper bit line 402B as described above in detail.

Referring now to FIG. 4B, 3D PCM memory device 401 is similar to 3D PCM memory device 300 in FIG. 3C except for the lower bit line and lower bit line contact. The structures, functions, and materials of the same components that have been described above with respect to 3D PCM memory device 300 in FIG. 3C are not repeated for ease of description. As shown in FIG. 4B, lower bit line 406A extends laterally beyond memory array 302 in the bit line direction (the y-direction), and lower bit line contact 408A in contact with lower bit line 406A is not disposed inclusively between lower and upper memory cells 314A and 314B of memory array 302 in the plan view, according to some embodiments. That is, upper bit line contact 310B is disposed within the memory array region of memory array 302, while lower bit line contact 408A is disposed outside of the memory array region of memory array 302, according to some embodiments. In some embodiments, lower bit line contact 408A and upper bit line contact 310B extend towards the same direction, e.g., upwards as shown in FIG. 4B, such that bit line contacts 408A and 310B can be padded-out from the samde side of 3D PCM memory device 400. Although lower bit line 406A extends beyond memory array 302 in FIG. 4B, it is understood that the critical dimension of lower bit line 406A may not increase, i.e., not forming a lower bit line extension, and the critical dimension (e.g., the diameter) of lower bit line contact 408A may not be greater than the critical dimension (e.g., the width in the x-direction) of lower bit line 406A as described above in detail.

FIGS. 5A-5L illustrate an exemplary fabrication process for forming a 3D PCM memory device, according to some embodiments of the present disclosure. FIG. 6 illustrates a flowchart of an exemplary method 600 for forming a 3D PCM memory device, according to some embodiments of the present disclosure. Examples of the 3D PCM memory device depicted in FIGS. 5A-5L and 6 include 3D PCM memory device 400 depicted in FIG. 4A. FIGS. 5A-5L and 6 will be described together. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, method 600 starts at operation 602, in which a lower bit line contact and a lower bit line in contact with the lower bit line contact are formed. In some embodiments, forming the lower bit line contact includes in-situ polymer deposition and etching, such that a critical dimension of the lower bit line contact is not greater than a critical dimension of the lower bit line. In some embodiments, to form the lower bit line, a layer of conductor is deposited, the layer of conductor is double patterned, and the double-patterned layer of conductor is etched. The layer of conductor can include tungsten. In some embodiments, the critical dimension of the lower bit line contact is not greater than the critical dimension of the lower bit line. For example, the critical dimension is not greater than about 60 nm, such as between about 10 nm and about 30 nm. In some embodiments, the lower bit line contact has the same pitch as the lower bit line. For example, the pitch is not greater than about 80 nm.

Figure 5A:
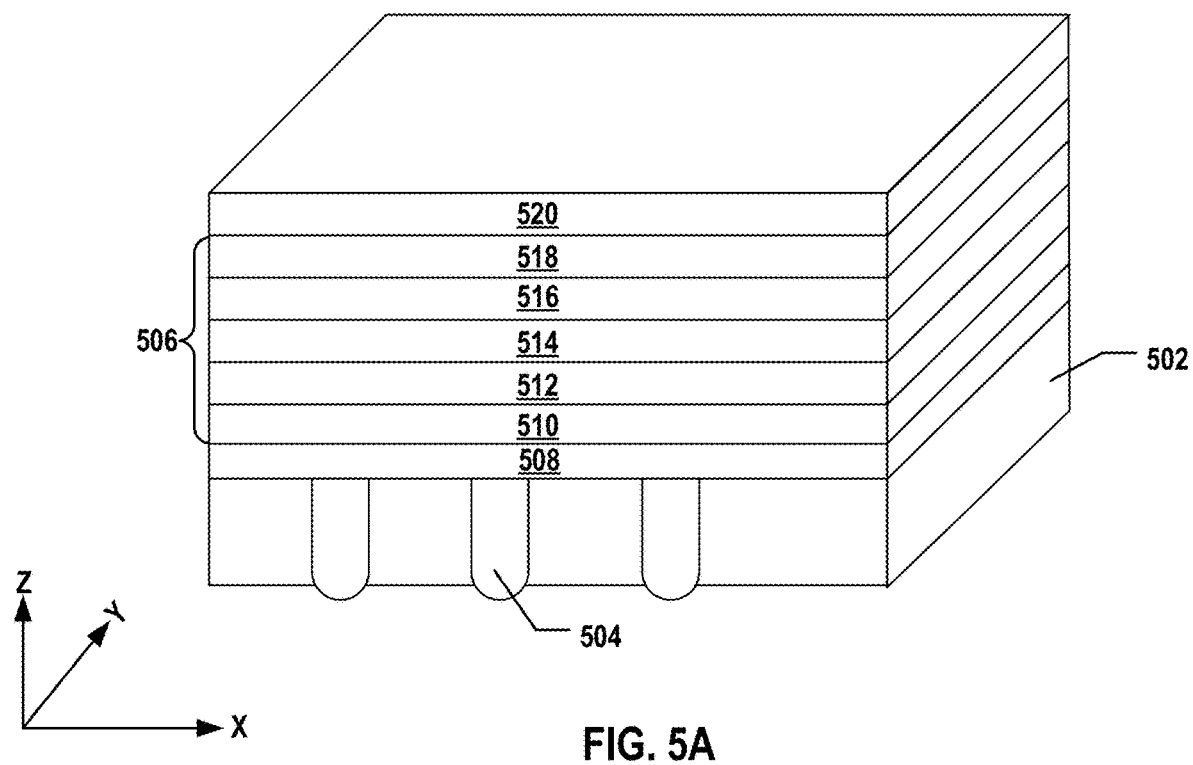
FIGS. 5A-5L illustrate an exemplary fabrication process for forming a 3D PCM memory device, according to some embodiments of the present disclosure.
Figure 6:
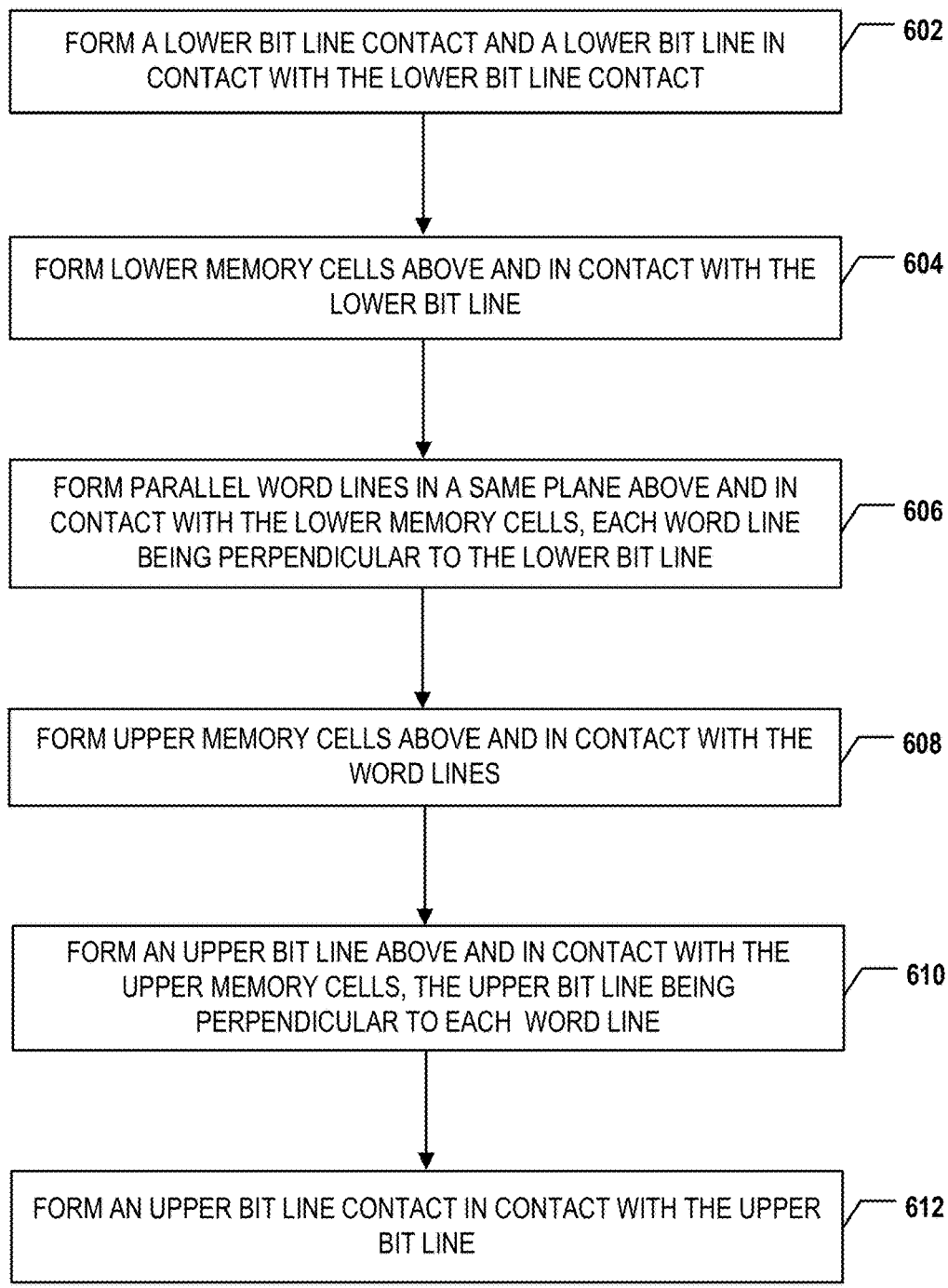
FIG. 6 illustrates a flowchart of an exemplary method for forming a 3D PCM memory device, according to some embodiments of the present disclosure.

Referring to FIG. 5A, a plurality of lower bit line contacts 504 are formed through a dielectric layer 502. To form the lower bit line contacts 504, dielectric layer 502 having a dielectric material, such as silicon oxide, can be first formed by one or more thin film deposition processes including, but not limited to, chemical vapor deposition (CVD), physical vapor deposition (PVD), atomic layer deposition (ALD), or any combination thereof. The contact holes (not shown) of lower bit line contacts 504 with non-relaxed critical dimension and pitch as described above in detail can be etched through dielectric layer 502 using in-situ polymer deposition and etching to control the dimension of the contact holes. For example, a plasma etching process may be modified such that polymer deposition (e.g., accumulation of a fluorocarbon polymer layer) occurs during plasma etching to control etch rate (also known as "polymerization"). Plasma etching may then be performed in the same plasma etcher to etch back and eventually remove the polymer layer. The in-situ polymer deposition and etching can further reduce the critical dimension of lower bit line contacts 504 after patterning in order to achieve shrunk contact size that may not be easily achieved by photolithography. For example, the critical dimension of the contact holes of lower bit line contacts 504 may be between about 50 nm and about 60 nm after photolithography and may be further reduced to about 20 nm and about 30 nm after in-situ polymer deposition and etching. After the formation of the contact holes, lower bit line contacts 504 can be formed by depositing one or more conductive materials, such as tungsten, to fill the contact holes using one or more thin film deposition processes including, but not limited to, CVD, PVD, ALD, or any combination thereof. Lower bit line contacts 504 can be further planarized by chemical mechanical polishing (CMP) and/or etching such that the upper ends (the tops surface) of lower bit line contacts 504 are flush with the top surface of dielectric layer 502.

As illustrated in FIG. 5A, a conductor layer 508 is formed on dielectric layer 502 and in contact with lower bit line contacts 504. In some embodiments, a metal layer, such as a tungsten layer, is deposited using one or more thin film deposition processes including, but not limited to, CVD, PVD, ALD, or any combination thereof. As described below in detail with respect to FIG. 5B, conductor layer 508 is then double patterned, and the double-patterned conductor layer 508 is etched to form lower bit lines 536 above and in contact with lower bit line contacts 504, respectively.

Method 600 proceeds to operation 604, as illustrated in FIG. 6, in which a plurality of lower memory cells are formed above and in contact with the lower bit line. Each of the lower memory cells can include stacked a PCM element, a selector, and a plurality of electrodes. In some embodiments, the lower bit line contact is disposed inclusively between the lower memory cells in the plan view. To form the plurality of lower memory cells, layers of a first conductor, an OTS material, a second conductor, a chalcogenide-based alloy, and a third conductor are subsequently deposited to form a memory stack, and the memory stack is subsequently etched in two perpendicular directions, according to some embodiments. Each of the first, second, and third conductors can include amorphous carbon. In some embodiments, to subsequently etch the memory stack, the memory stack is double patterned in a first direction of the two perpendicular directions, the double-patterned memory stack is etched in the first direction to form a first gap, the first gap is filled with a dielectric material, the etched memory stack is double patterned in a second direction of the two perpendicular directions, the double-patterned, etched memory stack is etched in the second direction to form a second gap, and the second gap is filled with the dielectric material.

As illustrated in FIG. 5A, a lower memory stack 506 is formed on conductor layer 508. In some embodiments, to form lower memory stack 506, a first conductor layer 510, an OTS material layer 512, a second conductor layer 514, a chalcogenide-based alloy layer 516, and a third conductor layer 518 are subsequently deposited using one or more thin film deposition processes including, but not limited to, CVD, PVD, ALD, electroplating, electrodeless plating, any other suitable deposition process, or any combination thereof. For example, each of first, second, and third conductor layers 510, 514, and 518 may include amorphous carbon, OTS material layer 512 may include $Zn_xTe_y$, $Ge_xTe_y$, $Nb_xO_y$, $Si_xAs_yTe_z$, etc., and chalcogenide-based alloy layer 516 may include GST alloy. It is understood that the sequence of depositing OTS material layer 512 and chalcogenide-based alloy layer 516 may be switched in some embodiments. In some embodiments, a dielectric layer 520 is formed on lower memory stack 506 by depositing dielectric materials, such as silicon nitride, using one or more thin film deposition processes including, but not limited to, CVD, PVD, ALD, or any combination thereof.

Figure 5B:
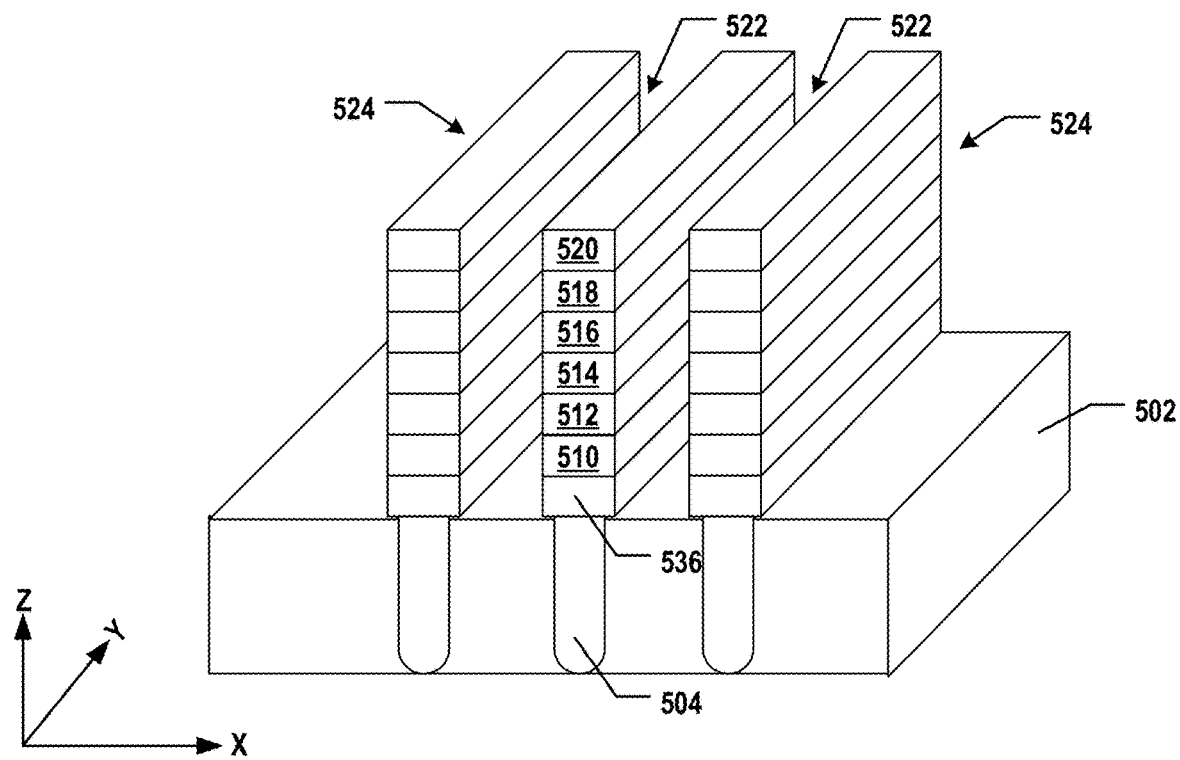
Figure 5C:
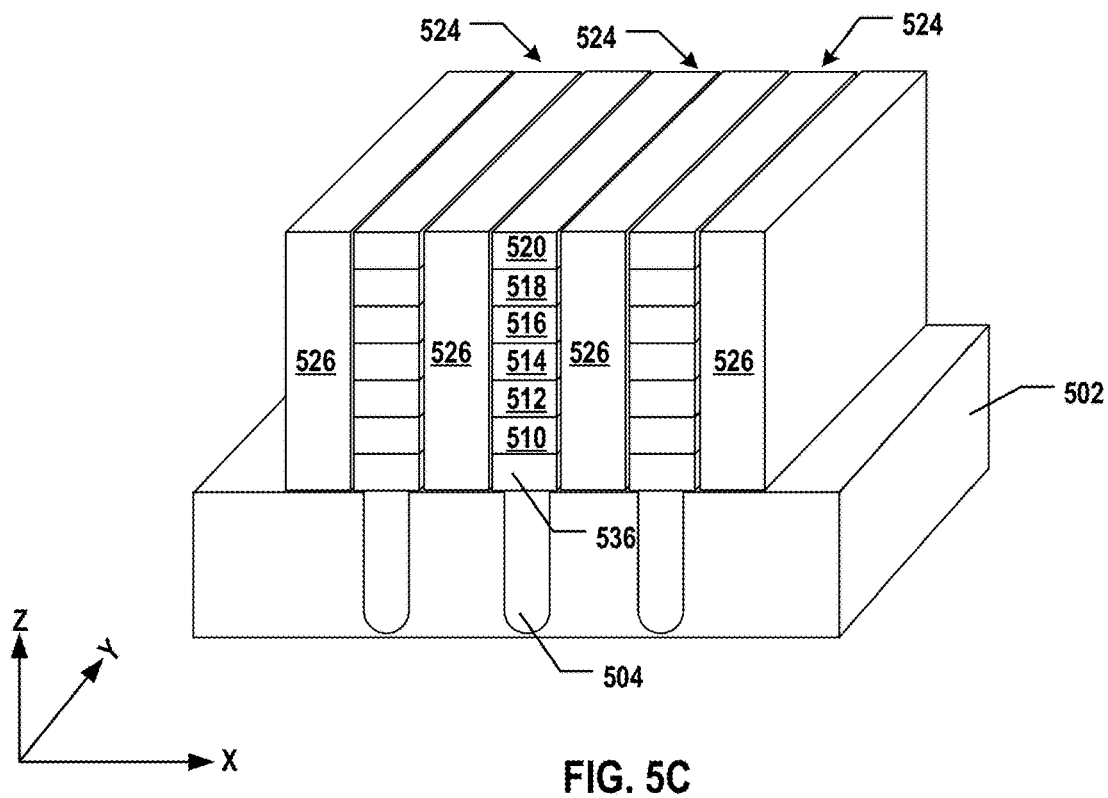
Figure 5D:
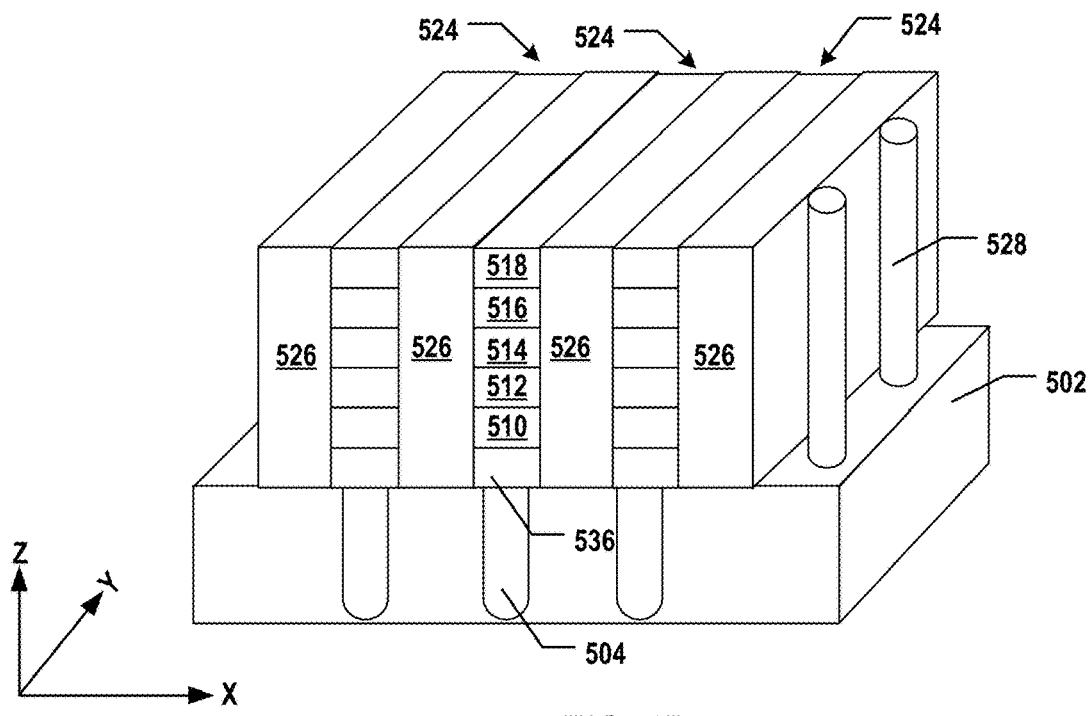

As illustrated in FIG. 5B, lower memory stack 506 and conductor layer 508 therebelow and dielectric layer 520 thereabove (as shown in FIG. 5A) are etched in the bit line direction (the y-direction). In some embodiments, lower memory stack 506, conductor layer 508, and dielectric layer 520 are double patterned first in the bit line direction. For example, an etching mask (not shown) is patterned on dielectric layer 520 by photolithography, development, and etching. The etching mask can be a photoresist mask or a hard mask patterned based on a photolithography mask. Double patterning can include, but not limited to, litho-etch-litho-etch (LELE) pitch-splitting or self-aligned double patterning (SADP), to control the critical dimensions of lower bit lines 536 and lower memory cells 538 (as shown in FIG. SG) to be formed. In some embodiments, double-patterned lower memory stack 506, conductor layer 508, and dielectric layer 520 are etched in the bit line direction to form parallel first gaps 522 in the bit line direction. Lower memory stack 506, conductor layer 508, and dielectric layer 520 can be etched through by one or more wet etching and/or dry etching processes, such as deep reactive-ion etching (DRIE), using the double-patterned etching mask to simultaneously form parallel first gaps 522. Parallel lower bit lines 536 extending along the bit line direction are thereby formed, which are above and in contact with lower bit line contacts 504, according to some embodiments. Etched memory stacks 524 are thereby formed as well, separated by first gaps 522.

As illustrated in FIG. SC, first gaps 522 (as shown in FIG. SC) are filled with a dielectric material 526, such as silicon oxide. In some embodiments, dielectric material 526 is deposited into first gaps 522 using one or more thin film deposition processes including, but not limited to, CVD, PVD, ALD, electroplating, electrodeless plating, any other suitable deposition process, or any combination thereof, followed by planarization processes, such as CMP and/or etching. For example, silicon oxide may be deposited into first gaps 522 using ALD, followed by CMP, to fill first gaps 522.

As illustrated in FIG. SD, a plurality of word line contacts 528 are formed on dielectric layer 502. In some embodiments, word line contacts 528 are formed first by patterning, followed by in-situ polymer deposition and etching, and one or more thin film deposition processes such as CVD, PVD, or ALD. The upper ends (the top surface) of word line contacts 528 can be planarized using CMP to be flush with the top surface of etched memory stacks 524. During the planarization processes, dielectric layer 520 (as shown in FIG. SC) and the top portion of dielectric material 526 are removed to expose the top surface of third conductor layers 518 of etched memory stacks 524, according to some embodiments.

Method 600 proceeds to operation 606, as illustrated in FIG. 6, in which a plurality of parallel word lines in the same plane are formed above and in contact with the lower memory cells. Each of the word lines can be perpendicular to the lower bit line. In some embodiments, to form the word lines, a layer of conductor is deposited, the layer of conductor is double patterned, and the double-patterned layer of conductor is etched.

Figure 5E:
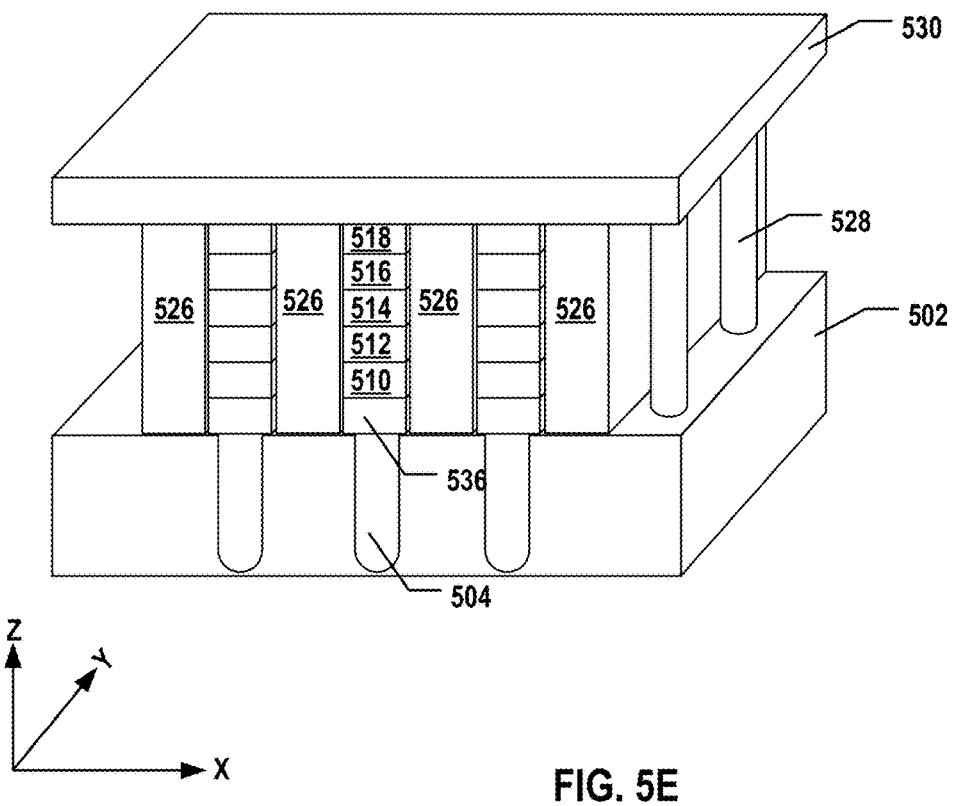
Figure 5F:
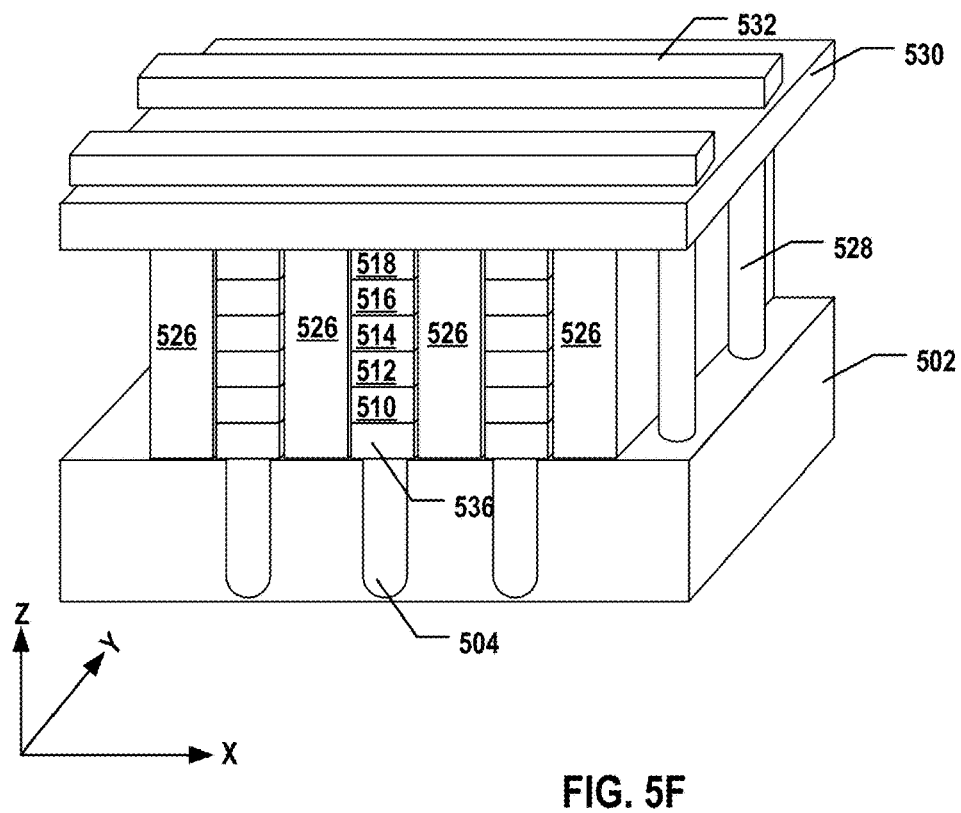
Figure 5G:
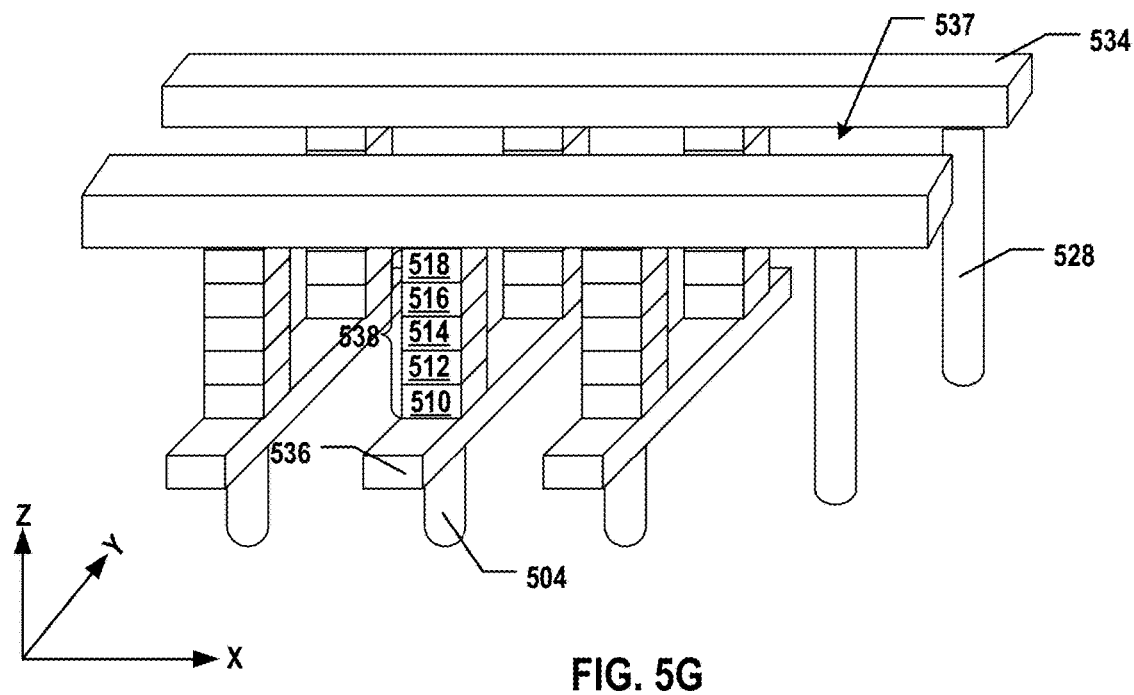

As illustrated in FIG. 5E, a conductor layer 530 is formed on etched memory stacks 524 and dielectric materials 526 and in contact with the upper ends of word line contacts 528. In some embodiments, a metal layer, such as a tungsten layer, is deposited using one or more thin film deposition processes including, but not limited to, CVD, PVD, ALD, or any combination thereof.

As illustrated in FIG. SF, conductor layer 530 is then double patterned in the word line direction (the x-direction) to form etching masks 532 extending along the word line direction. Etching masks 532 can be patterned on conductor layer 530 by photolithography, development, and etching. Etching masks 532 can be photoresist masks or hard masks patterned based on a photolithography mask. Double patterning can include, but not limited to, LELE pitch-splitting or SADP, to control the critical dimensions of lower word lines 534 and lower memory cells 538 (as shown in FIG. SG) to be formed. The double patterning process in FIG. SF is performed in the word line direction, which is perpendicular to the bit line direction in which the double patterning process in FIG. 5B is performed.

As illustrated in FIG. SG, conductor layer 530 (as shown in FIG. SF) and etched memory stacks 524 therebelow are etched in the word line direction (the x-direction) to form second gaps 537 in the word line direction. The etching stops at lower bit lines 536, such that lower bit lines 536 remain intact, according to some embodiments. Conductor layer 530 and etched memory stacks 524 can be etched through by one or more wet etching and/or dry etching processes, such as DRIE, using etching masks 532 to simultaneously form parallel second gaps 537. Parallel lower word lines 534 extending along the word line direction are thereby formed to be above and in contact with word line contacts 528, according to some embodiments. Lower memory cells 538 are thereby formed as well at intersections of lower bit lines 536 and lower word lines 534, respectively. Each lower memory cell 538 can include first conductor layer 510 (as the first electrode), OTS material layer 512 (as the selector), second conductor layer 514 (as the second electrode), chalcogenide-based alloy layer 516 (as the PCM element), and third conductor layer 518 (as the third electrode). Lower memory cells 538 are above and in contact with lower bit lines 536, according to some embodiments. In some embodiments, lower memory cells 538 are patterned (e.g., by the double patterning process in FIG. SF), such that each lower bit line contacts 504 is disposed inclusively between lower memory cells 538 in the plan view.

Although not shown, second gaps 537 may be filled with a dielectric material, such as silicon oxide. In some embodiments, the dielectric material is deposited into second gaps 537 using one or more thin film deposition processes including, but not limited to, CVD, PVD, ALD, electroplating, electrodeless plating, any other suitable deposition process, or any combination thereof, followed by planarization processes, such as CMP and/or etching. For example, silicon oxide may be deposited into second gaps 537 using ALD, followed by CMP, to fill second gaps 537.

Method 600 proceeds to operation 608, as illustrated in FIG. 6, in which a plurality of upper memory cells are formed above and in contact with the word lines. Each of the upper memory cells can include stacked a PCM element, a selector, and a plurality of electrodes. Each of the upper memory cells can be in contact with a respective one of the word lines. To form the plurality of upper memory cells, layers of a first conductor, an OTS material, a second conductor, a chalcogenide-based alloy, and a third conductor are subsequently deposited to form a memory stack, and the memory stack is subsequently etched in two perpendicular directions, according to some embodiments. Each of the first, second, and third conductors can include amorphous carbon. In some embodiments, to subsequently etch the memory stack, the memory stack is double patterned in a first direction of the two perpendicular directions, the double-patterned memory stack is etched in the first direction to form a first gap, the first gap is filled with a dielectric material, the etched memory stack is double patterned in a second direction of the two perpendicular directions, the double-patterned, etched memory stack is etched in the second direction to form a second gap, and the second gap is filled with the dielectric material.

Figure 5H:
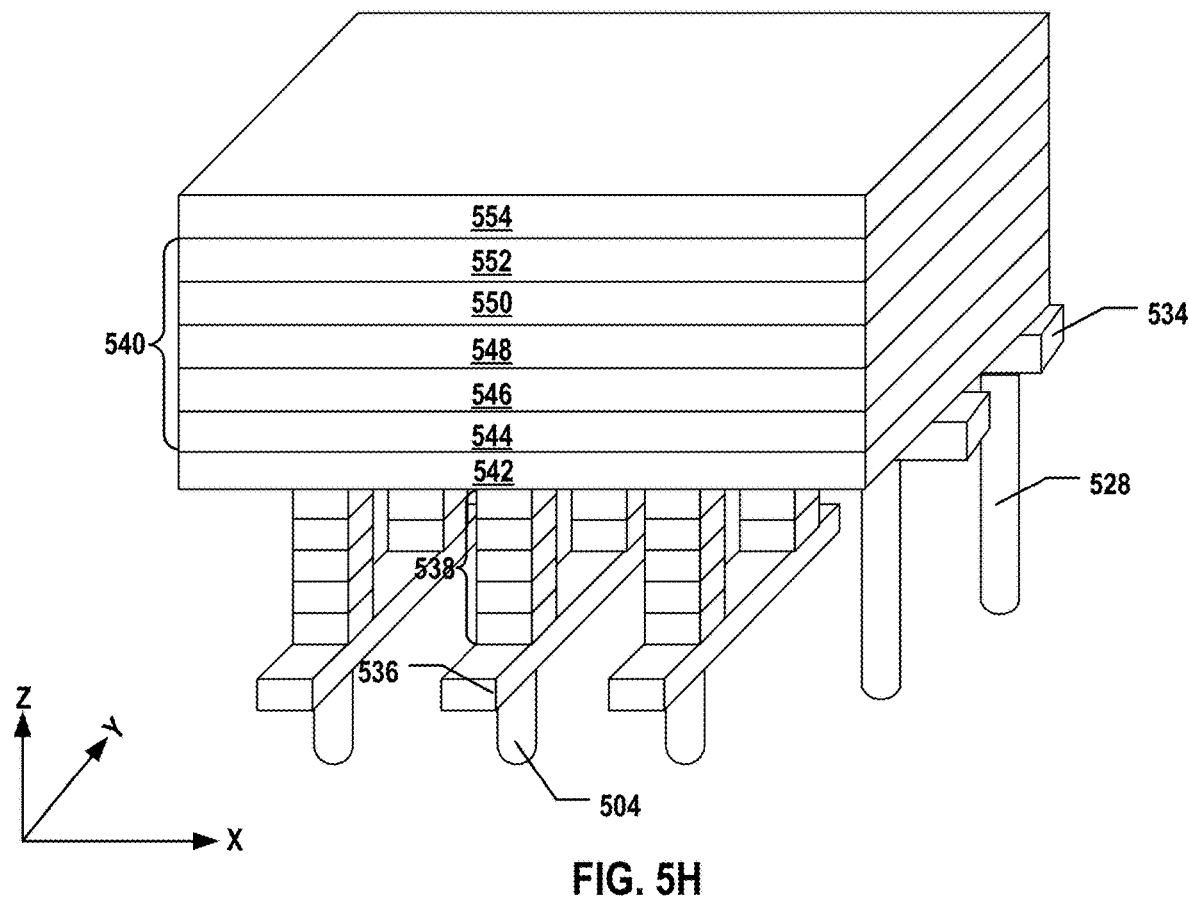

As illustrated in FIG. 5H, a conductor layer 542 is formed on lower word lines 534, and an upper memory stack 540 is formed on conductor layer 542. In some embodiments, to form upper memory stack 540, a first conductor layer 544, an OTS material layer 546, a second conductor layer 548, a chalcogenide-based alloy layer 550, and a third conductor layer 552 are subsequently deposited using one or more thin film deposition processes including, but not limited to, CVD, PVD, ALD, electroplating, electrodeless plating, any other suitable deposition process, or any combination thereof. For example, each of first, second, and third conductor layers 544, 548, and 552 may include amorphous carbon, OTS material layer 546 may include $Zn_xTe_y$, $Ge_x$-$Te_y$, $Nb_xO_y$, $Si_xAs_yTe_z$, etc., and chalcogenide-based alloy layer 550 may include GST alloy. It is understood that the sequence of depositing OTS material layer 546 and chalcogenide-based alloy layer 550 may be switched in some embodiments. In some embodiments, a dielectric layer 554 is formed on upper memory stack 540 by depositing dielectric materials, such as silicon nitride, using one or more thin film deposition processes including, but not limited to, CVD, PVD, ALD, or any combination thereof.

Figure 5I:
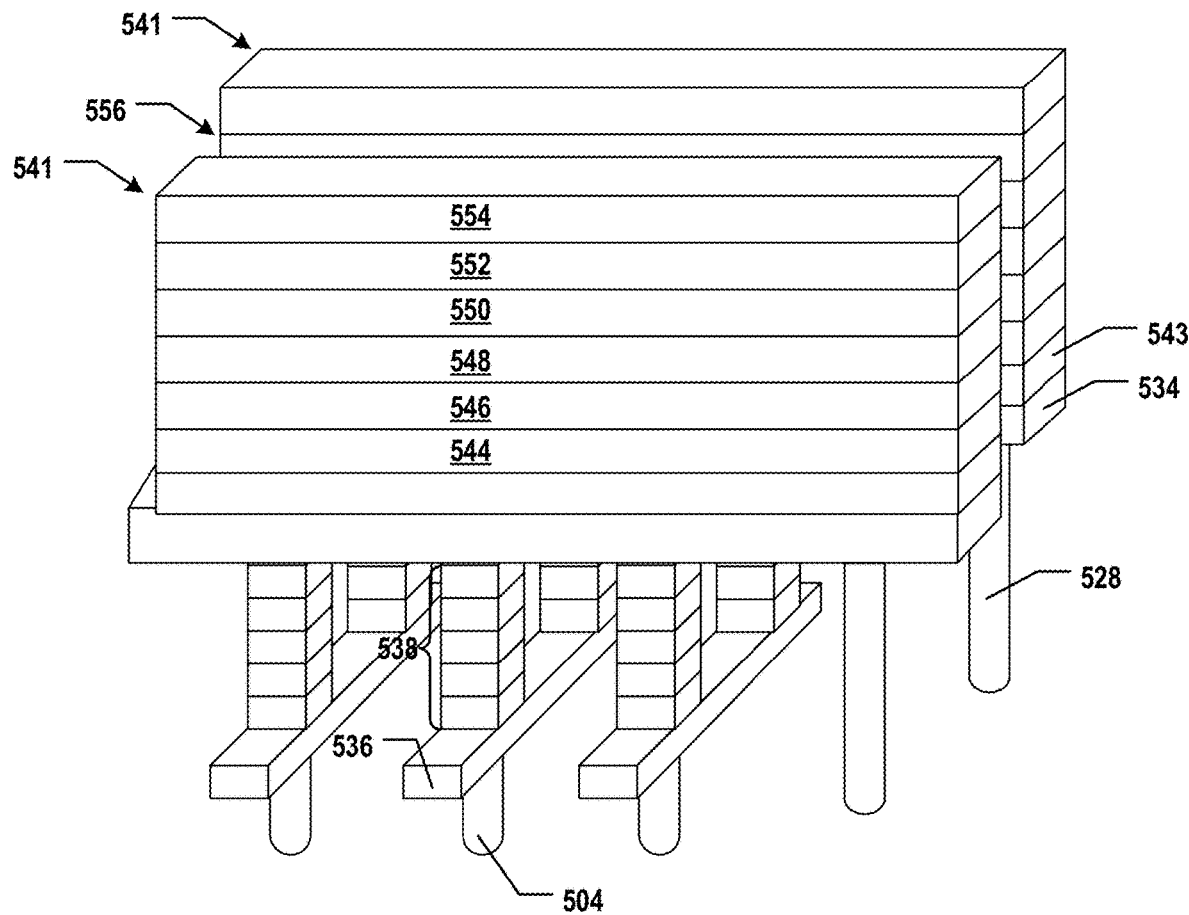

As illustrated in FIG. 5I, upper memory stack 540 and conductor layer 542 therebelow (as shown in FIG. 5H) and dielectric layer 554 thereabove are etched in the word line direction (the x-direction). In some embodiments, upper memory stack 540, conductor layer 542, and dielectric layer 554 are double patterned first in the word line direction. For example, an etching mask (not shown) is patterned on dielectric layer 554 by photolithography, development, and etching. The etching mask can be a photoresist mask or a hard mask patterned based on a photolithography mask. Double patterning can include, but not limited to, LELE pitch-splitting or SADP, to control the critical dimensions of upper word lines 534 and upper memory cells 562 (as shown in FIG. 5L) to be formed. In some embodiments, double-patterned upper memory stack 540, conductor layer 542, and dielectric layer 554 are etched in the word line direction to form parallel first gaps 556 in the word line direction. Upper memory stack 540, conductor layer 542, and dielectric layer 554 can be etched through by one or more wet etching and/or dry etching processes, such as DRIE, using the double-patterned etching mask to simultaneously form parallel first gaps 556. Parallel upper word lines 543 extending along the word line direction are thereby formed to be above and in contact with lower word line 534, according to some embodiments. Etched memory stacks 541 are thereby formed as well, separated by first gaps 556. It is understood that in some embodiments, conductor layer 542 and resulting upper word lines 543 may be omitted, such that the word lines include only lower word lines 534, but not upper word lines 543.

Although not shown, first gaps 556 may be filled with a dielectric material, such as silicon oxide. In some embodiments, the dielectric material is deposited into first gaps 556 using one or more thin film deposition processes including, but not limited to, CVD, PVD, ALD, electroplating, electrodeless plating, any other suitable deposition process, or any combination thereof, followed by planarization processes, such as CMP and/or etching. For example, silicon oxide may be deposited into first gaps 556 using ALD, followed by CMP, to fill first gaps 556.

In some embodiments, an upper bit line contact is formed prior to the formation of upper memory cells. Forming the upper bit line contact can include in-situ polymer deposition and etching, such that a critical dimension of the upper bit line contact is not greater than a critical dimension of the upper bit line. For example, the critical dimension is not greater than about 60 nm, such as between about 10 nm and about 30 nm. In some embodiments, the upper bit line contact has the same pitch as the upper bit line. For example, the pitch is not greater than about 80 nm.

Figure 5J:
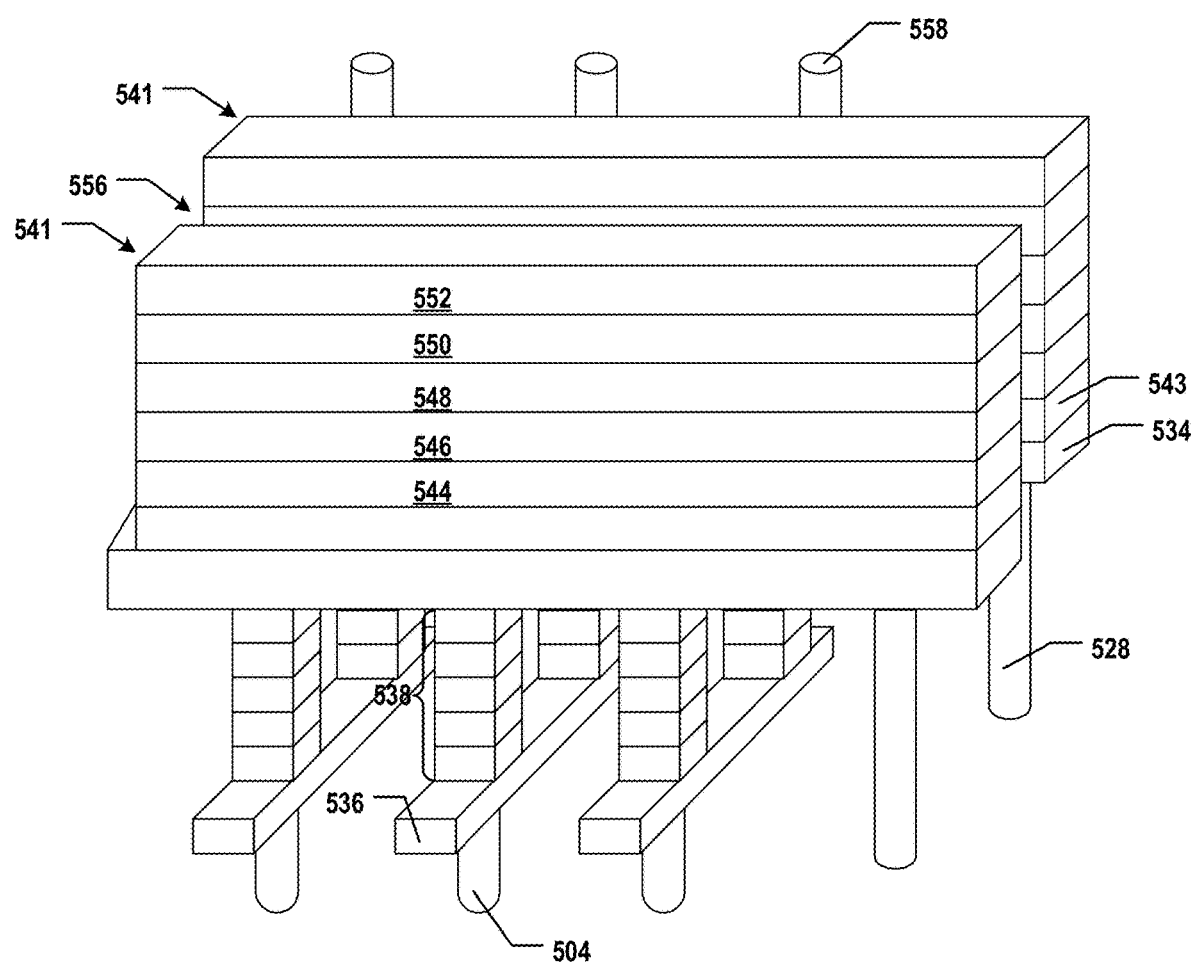

As illustrated in FIG. 5J, a plurality of upper bit line contacts 558 are formed. In some embodiments, upper bit line contacts 558 are formed first by patterning, followed by in-situ polymer deposition and etching. The contact holes (not shown) of upper bit line contacts 558 with non-relaxed critical dimension and pitch as described above in detail can be etched using in-situ polymer deposition and etching to control the dimension of the contact holes. For example, a plasma etching process may be modified such that polymer deposition (e.g., accumulation of a fluorocarbon polymer layer) occurs during plasma etching to control etch rate (also known as "polymerization"). Plasma etching may then be performed in the same plasma etcher to etch back and eventually remove the polymer layer. The in-situ polymer deposition and etching can further reduce the critical dimension of upper bit line contacts 558 after patterning in order to achieve shrunk contact size that may not be easily achieved by photolithography. After the formation of the contact holes, upper bit line contacts 558 can be formed by depositing one or more conductive materials, such as tungsten, to fill the contact holes using one or more thin film deposition processes including, but not limited to, CVD, PVD, ALD, or any combination thereof. The upper ends (the top surface) of upper bit line contacts 558 can be planarized using CMP to be flush with the top surface of etched memory stacks 541. During the planarization processes, dielectric layer 554 (shown in FIG. 5I) and the top portion of dielectric materials (not shown) filing first gaps 556 are removed to expose the top surface of third conductor layers 552 of etched memory stacks 541, according to some embodiments.

Method 600 proceeds to operation 610, as illustrated in FIG. 6, in which an upper bit line is formed above and in contact with the upper memory cells. The upper bit line can be perpendicular to each of the word lines. In some embodiments, to form the upper bit line, a layer of conductor is deposited, the layer of conductor is double patterned, and the double-patterned layer of conductor is etched.

Figure 5K:
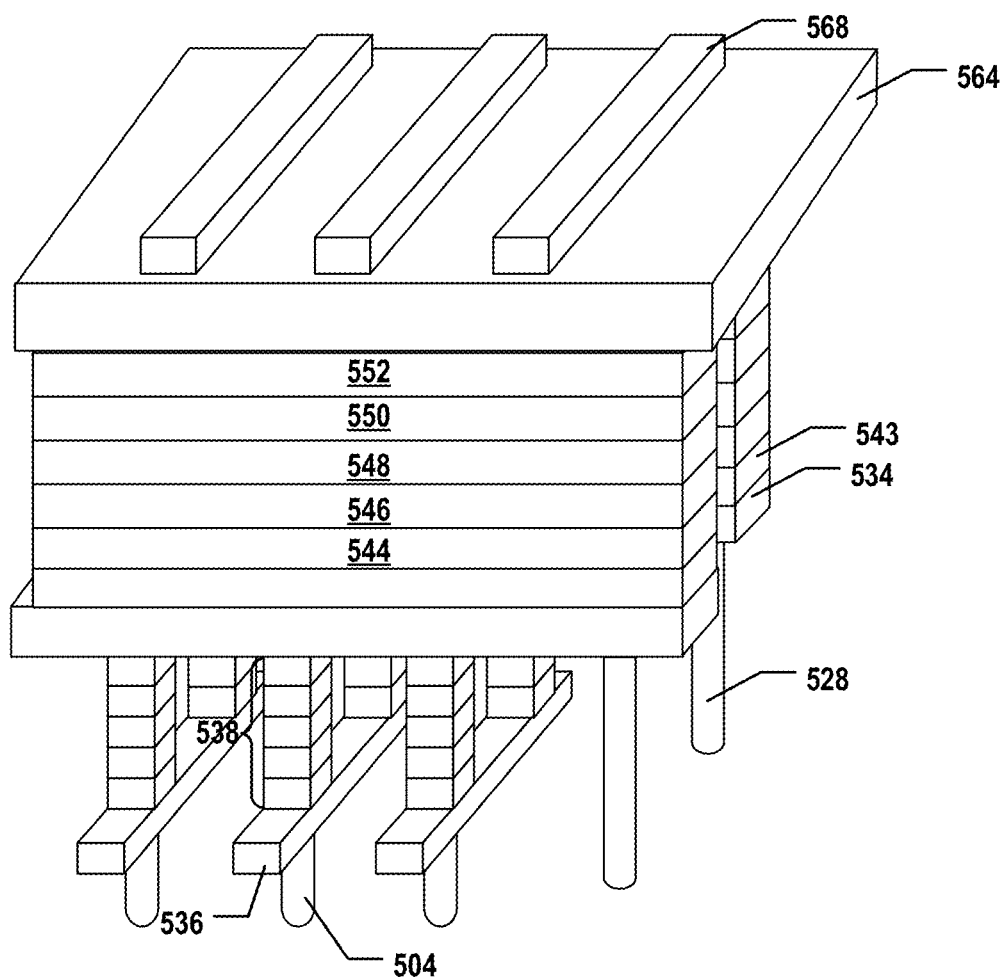
Figure 5L:
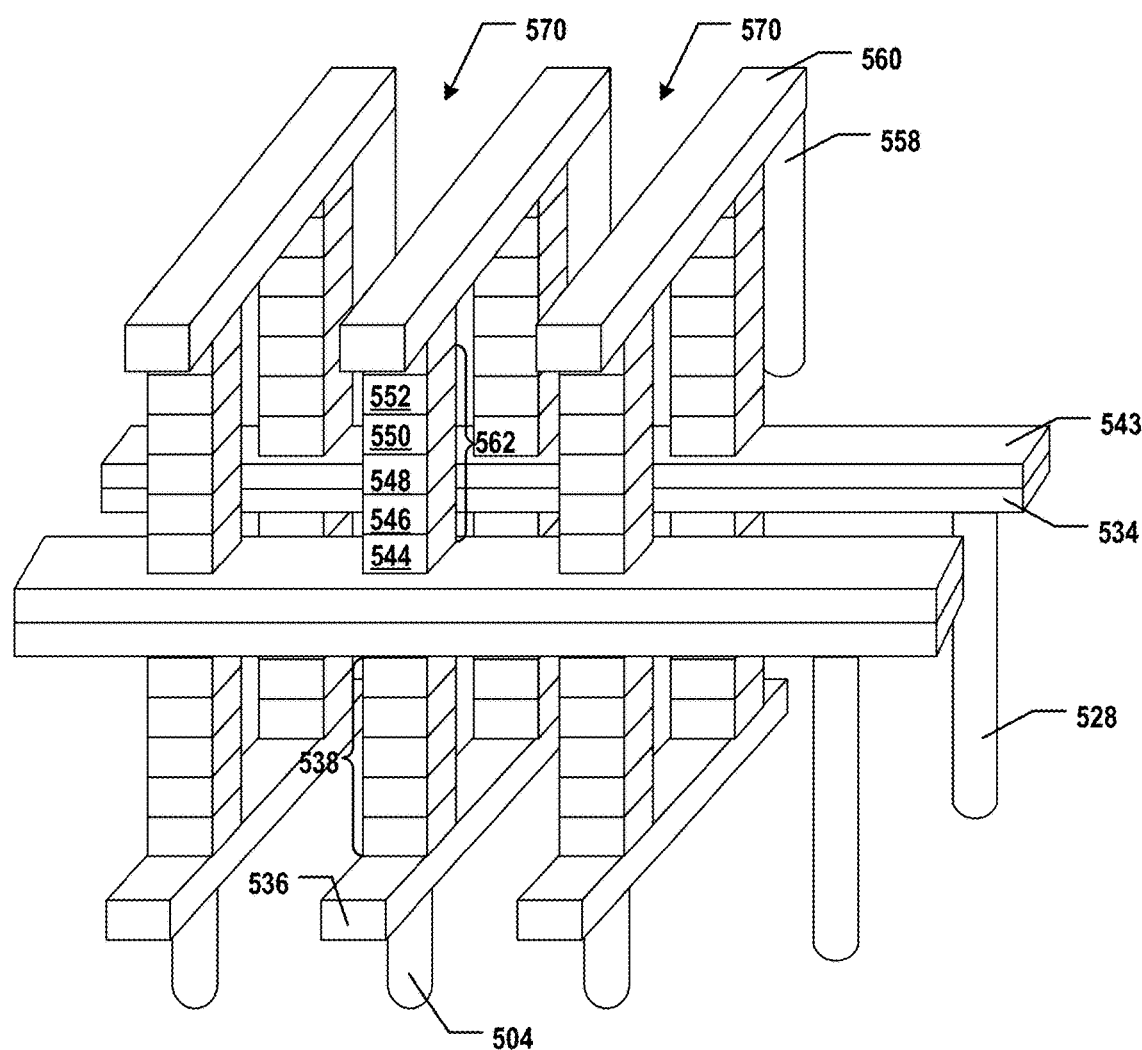

As illustrated in FIG. 5K, a conductor layer 564 is formed on etched memory stacks 541 and the dielectric materials (not shown) filling first gaps 556 (as shown in FIG. 5J). Conductor layer 564 is above and in contact with upper bit line contacts 558 and etched memory stacks 541 (as shown in FIG. 5J), according to some embodiments. In some embodiments, a metal layer, such as a tungsten layer, is deposited using one or more thin film deposition processes including, but not limited to, CVD, PVD, ALD, or any combination thereof.

As illustrated in FIG. 5K, conductor layer 564 is then double patterned in the bit line direction (the y-direction) to form etching masks 568 extending along the bit line direction. Etching masks 568 can be patterned on conductor layer 564 by photolithography, development, and etching. Etching masks 568 can be photoresist masks or hard masks patterned based on a photolithography mask. Double patterning can include, but not limited to, LELE pitch-splitting or SADP, to control the critical dimensions of upper bit lines 560 and upper memory cells 562 (as shown in FIG. 5L) to be formed. The double patterning process in FIG. 5K is performed in the bit line direction, which is perpendicular to the word line direction in which the double patterning process in FIG. 5I is performed.

As illustrated in FIG. 5L, conductor layer 564 (as shown in FIG. 5K) and etched memory stacks 541 therebelow are etched in the bit line direction (the y-direction) to form second gaps 570 in the bit line direction. The etching stops at upper word lines 543, such that upper word lines 543 remain intact, according to some embodiments. Conductor layer 564 and etched memory stacks 541 can be etched through by one or more wet etching and/or dry etching processes, such as DRIE, using etching masks 568 (as shown in FIG. 5K) to simultaneously form parallel second gaps 570. Parallel upper bit lines 560 extending along the bit line direction are thereby formed to be above and in contact with upper bit line contacts 558, according to some embodiments. Upper memory cells 562 are thereby formed as well at intersections of upper bit lines 560 and upper word lines 543, respectively. Each upper memory cell 562 can include first conductor layer 544 (as the first electrode), OTS material layer 546 (as the selector), second conductor layer 548 (as the second electrode), chalcogenide-based alloy layer 550 (as the PCM element), and third conductor layer 552 (as the third electrode). Upper bit lines 560 are also above and in contact with upper memory cells 562, according to some embodiments. The top surface of each upper memory cell 562 is flush with the top surface (the upper ends) of upper bit line contacts 558, according to some embodiments.

Although not shown, second gaps 570 may be filled with a dielectric material, such as silicon oxide. In some embodiments, the dielectric material is deposited into second gaps 570 using one or more thin film deposition processes including, but not limited to, CVD, PVD, ALD, electroplating, electrodeless plating, any other suitable deposition process, or any combination thereof, followed by planarization processes, such as CMP and/or etching. For example, silicon oxide may be deposited into second gaps 570 using ALD, followed by CMP, to fill second gaps 570.

As described above, upper bit line contacts 558 are formed prior to the formation of upper memory cells 562. Thus, as shown in FIG. 5L, upper bit line contacts 558, which extend downwards, are not formed inclusively between upper memory cells 562 in the plan view. It is understood that in some embodiments, the upper bit line contacts may be formed after the formation of upper memory cells 562, such that the upper bit line contacts can be formed inclusively between upper memory cells 562 in the plan view. For example, method 600 may optionally proceed to operation 612, as illustrated in FIG. 6, in which an upper bit line contact is formed above and in contact with the upper bit line. In some embodiments, the upper bit line contact is disposed inclusively between the upper memory cells in the plan view. In some embodiments, forming the upper bit line contact includes in-situ polymer deposition and etching, such that a critical dimension of the upper bit line contact is not greater than a critical dimension of the upper bit line. For example, the critical dimension is not greater than about 60 nm, such as between about 10 nm and about 30 nm. In some embodiments, the upper bit line contact has the same pitch as the upper bit line. For example, the pitch is not greater than about 80 nm. The details of forming the upper bit line contacts are substantially similar to those of forming lower bit line contacts 504 described above with respect to FIG. 5A and thus, are not repeated for ease of description. Once formed, the upper bit line contacts are above and in contact with upper bit lines 560 and are also inclusively between upper memory cells 562 in the plan view, according to some embodiments.

According to one aspect of the present disclosure, a 3D memory device includes a lower bit line and an upper bit line parallel to one another, a plurality of parallel word lines, a plurality of lower memory cells and a plurality of upper memory cells, a lower bit line contact in contact with the lower bit line, and an upper bit line contact in contact with the upper bit line. The parallel word lines are in the same plane between the lower bit line and the upper bit line. Each of the word lines is perpendicular to the lower bit line and the upper bit line. The plurality of lower memory cells each are disposed at an intersection of the lower bit line and a respective one of the word lines. The plurality of upper memory cells each are disposed at an intersection of the upper bit line and a respective one of the word lines. Each of the lower and upper memory cells includes stacked a PCM element, a selector, and a plurality of electrodes. At least one of the lower bit line contact and the upper bit line contact is disposed inclusively between the lower and upper memory cells in a plan view.

In some embodiments, the at least one of the lower and upper bit line contacts overlaps at least one of the lower and upper memory cells in the plan view.

In some embodiments, the at least one of the lower and upper bit line contacts is disposed between the lower and upper memory cells in the plan view.

In some embodiments, each of the lower and upper bit line contacts is disposed inclusively between the lower and upper memory cells in the plan view. In some embodiments, the lower bit line contact extends downwards, and the upper bit line contact extends upwards.

In some embodiments, the lower bit line contact or the upper bit line contact is disposed inclusively between the lower and upper memory cells in the plan view, and the lower bit line contact and the upper bit line contact extend towards a same direction.

In some embodiments, a critical dimension of the at least one of the lower and upper bit line contacts is not greater than a critical dimension of the corresponding lower bit line or upper bit line.

In some embodiments, the at least one of the lower and upper bit line contacts has a same pitch as the corresponding lower bit line or upper bit line.

In some embodiments, the PCM element includes a chalcogenide-based alloy, and the selector includes an OTS material.

In some embodiments, the 3D memory device is a 3D XPoint memory.

According to another aspect of the present disclosure, a 3D memory device includes a lower bit line and an upper bit line parallel to one another, a plurality of parallel word lines, a plurality of lower memory cells and a plurality of upper memory cells, a lower bit line contact in contact with the lower bit line, and an upper bit line contact in contact with the upper bit line. The parallel word lines are in a same plane between the lower bit line and the upper bit line. Each of the word lines is perpendicular to the lower bit line and the upper bit line. The plurality of lower memory cells each are disposed at an intersection of the lower bit line and a respective one of the word lines. The plurality of upper memory cells each are disposed at an intersection of the upper bit line and a respective one of the word lines. Each of the lower and upper memory cells includes stacked a PCM element, a selector, and a plurality of electrodes. A critical dimension of at least one of the lower bit line contact and the upper bit line contact is not greater than a critical dimension of the corresponding lower bit line or upper bit line.

In some embodiments, the critical dimension of the at least one of the lower and upper bit line contacts is not greater than about 60 nm. In some embodiments, the critical dimension of the at least one of the lower and upper bit line contacts is between about 10 nm and about 30 nm.

In some embodiments, the at least one of the lower and upper bit line contacts has a same pitch as the corresponding lower bit line or upper bit line. In some embodiments, the pitch is not greater than about 80 nm.

In some embodiments, the critical dimension of each of the lower and upper bit line contacts is not greater than the critical dimension of each of the lower and upper bit lines.

In some embodiments, the at least one of the lower bit line contact and the upper bit line contact is disposed inclusively between the lower and upper memory cells in a plan view.

In some embodiments, each of the lower and upper bit line contacts is disposed inclusively between the lower and upper memory cells in the plan view. In some embodiments, the lower bit line contact extends downwards, and the upper bit line contact extends upwards.

In some embodiments, the lower bit line contact or the upper bit line contact is disposed inclusively between the lower and upper memory cells in the plan view, and the lower bit line contact and the upper bit line contact extend towards a same direction.

In some embodiments, the PCM element includes a chalcogenide-based alloy, and the selector includes an OTS material.

In some embodiments, the 3D memory device is a 3D XPoint memory.

According to still another aspect of the present disclosure, a 3D memory device includes an array of 3D PCM cells disposed in a memory array region, a plurality of word lines and a plurality of bit lines of the 3D PCM cells in a cross-point structure, and a plurality of bit line contacts. Each of the word lines extends across the memory array region in a word line direction. Each of the bit lines extends across the memory array region in a bit line direction perpendicular to the word line direction. At least some of the bit line contacts are disposed within the memory array region.

In some embodiments, each of the bit line contacts is disposed within the memory array region. In some embodiments, the bit line contacts are disposed in two bit line contact regions at two ends of the memory array region in the bit line direction.

In some embodiments, the 3D memory device further includes a plurality of word line contacts each are disposed within the memory array region. In some embodiments, the word line contacts are disposed in a word line contact region at a middle of the memory array region in the word line direction.

In some embodiments, each of the array of 3D PCM cells includes a stacked PCM element, a selector, and a plurality of electrodes. In some embodiments, the PCM element includes a chalcogenide-based alloy, and the selector includes an OTS material.

In some embodiments, the 3D memory device is a 3D XPoint memory.

The foregoing description of the specific embodiments will so reveal the general nature of the present disclosure that others can, by applying knowledge within the skill of the art, readily modify and/or adapt for various applications of such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
    a lower bit line and an upper bit line parallel to one another;
    a plurality of parallel word lines in a same plane between the lower bit line and the upper bit line, each of the word lines being perpendicular to the lower bit line and the upper bit line;
    a plurality of lower memory cells each disposed at an intersection of the lower bit line and a respective one of the word lines, and a plurality of upper memory cells each disposed at an intersection of the upper bit line and the respective one of the word lines, each of the lower and upper memory cells comprising stacked a phase-change memory (PCM) element, a selector, and a plurality of electrodes; and
    a lower bit line contact in contact with the lower bit line, and an upper bit line contact in contact with the upper bit line,
    wherein at least one of the lower bit line contact and the upper bit line contact directly aligns at least one of the lower and upper memory cells in a plan view.

2. The 3D memory device of claim 1, wherein the at least one of the lower and upper bit line contacts overlaps at least one of the lower and upper memory cells in the plan view.

3. The 3D memory device of claim 1, wherein the at least one of the lower and upper bit line contacts is disposed between the lower and upper memory cells in the plan view.

4. The 3D memory device of claim 1, wherein each of the lower and upper bit line contacts is disposed inclusively between the lower and upper memory cells in the plan view.

5. The 3D memory device of claim 4, wherein the lower bit line contact extends downwards, and the upper bit line contact extends upwards.

6. The 3D memory device of claim 1, wherein
the lower bit line contact or the upper bit line contact is disposed inclusively between the lower and upper memory cells in the plan view; and
the lower bit line contact and the upper bit line contact extend towards a same direction.

7. The 3D memory device of claim 1, wherein a critical dimension of the at least one of the lower and upper bit line contacts is not greater than a critical dimension of the corresponding lower bit line or upper bit line.

8. The 3D memory device of claim 7, wherein the at least one of the lower and upper bit line contacts has a same pitch as the corresponding lower bit line or upper bit line.

9. The 3D memory device of claim 1, wherein the PCM element comprises a chalcogenide-based alloy, and the selector comprises an ovonic threshold switch (OTS) material.

10. The 3D memory device of claim 1, wherein the 3D memory device is a cross-point structure memory.

11. A three-dimensional (3D) memory device, comprising:
a lower bit line and an upper bit line parallel to one another;
a plurality of parallel word lines in a same plane between the lower bit line and the upper bit line, each of the word lines being perpendicular to the lower bit line and the upper bit line;
a plurality of lower memory cells each disposed at an intersection of the lower bit line and a respective one of the word lines, and a plurality of upper memory cells each disposed at an intersection of the upper bit line and the respective one of the word lines, each of the lower and upper memory cells comprising stacked a phase-change memory (PCM) element, a selector, and a plurality of electrodes; and
a lower bit line contact in contact with the lower bit line, and an upper bit line contact in contact with the upper bit line,
wherein a critical dimension of at least one of the lower bit line contact and the upper bit line contact is not greater than a critical dimension of the corresponding lower bit line or upper bit line; and
wherein at least one of the lower bit line contact and the upper bit line contact directly aligns at least one of the lower and upper memory cells in a plan view.

12. The 3D memory device of claim 11, wherein the critical dimension of the at least one of the lower and upper bit line contacts is not greater than about 60 nm.

13. The 3D memory device of claim 12, wherein the critical dimension of the at least one of the lower and upper bit line contacts is between about 10 nm and about 30 nm.

14. The 3D memory device of claim 11, wherein the at least one of the lower and upper bit line contacts has a same pitch as the corresponding lower bit line or upper bit line.

15. The 3D memory device of claim 14, wherein the pitch is not greater than about 80 nm.

16. The 3D memory device of claim 11, wherein the critical dimension of each of the lower and upper bit line contacts is not greater than the critical dimension of each of the lower and upper bit lines.

17. The 3D memory device of claim 11, wherein the at least one of the lower bit line contact and the upper bit line contact is disposed inclusively between the lower and upper memory cells in the plan view.

18. The 3D memory device of claim 17, wherein each of the lower and upper bit line contacts is disposed inclusively between the lower and upper memory cells in the plan view.

19. The 3D memory device of claim 11, wherein the PCM element comprises a chalcogenide-based alloy, and the selector comprises an ovonic threshold switch (OTS) material.

20. A three-dimensional (3D) memory device, comprising:
an array of 3D phase-change memory (PCM) cells disposed in a memory array region;
a plurality of word lines and a plurality of bit lines of the 3D PCM cells in a cross-point structure, wherein each of the word lines extends across the memory array region in a word line direction, and each of the bit lines extends across the memory array region in a bit line direction perpendicular to the word line direction; and
a plurality of bit line contacts, wherein at least some of the bit line contacts directly aligns the memory array region in a plan view.

* * * * *